United States Patent
Park et al.

(10) Patent No.: US 10,317,922 B2
(45) Date of Patent: Jun. 11, 2019

(54) POWER SUPPLY MANAGEMENT CIRCUIT CONFIGURED TO MANAGE POWER TRANSFER WITH LIMITING CURRENT INTENSITY, AND STORAGE DEVICE AND COMMUNICATION CABLE INCLUDING THE SAME

(71) Applicant: Samsung Electronics Co., Ltd., Suwon-si, Gyeonggi-do (KR)

(72) Inventors: Iksung Park, Seoul (KR); Heeyoub Kang, Seoul (KR); Kyoungeun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 15/223,827

(22) Filed: Jul. 29, 2016

(65) Prior Publication Data
US 2017/0060158 A1   Mar. 2, 2017

(30) Foreign Application Priority Data

Sep. 2, 2015 (KR) .................. 10-2015-0124265

(51) Int. Cl.
| | | |
|---|---|---|
| *G01F 1/00* | (2006.01) | |
| *H02J 4/00* | (2006.01) | |
| *G05F 1/625* | (2006.01) | |
| *G11C 16/30* | (2006.01) | |

(52) U.S. Cl.
CPC .............. *G05F 1/625* (2013.01); *G11C 16/30* (2013.01); *H02J 4/00* (2013.01)

(58) Field of Classification Search
CPC ............. G05F 1/625; G11C 16/30; H02J 4/00
USPC .... 365/185.18; 327/180, 309, 312, 530, 540
See application file for complete search history.

(56) References Cited

U.S. PATENT DOCUMENTS

| | | | | |
|---|---|---|---|---|
| 5,748,466 A | * | 5/1998 | McGivern .............. | A01G 25/16 239/63 |
| 6,194,856 B1 | * | 2/2001 | Kobayashi ............ | H02M 7/003 318/432 |
| 7,532,448 B2 | * | 5/2009 | So .......................... | H02H 3/006 361/93.3 |
| 7,672,107 B2 | * | 3/2010 | So .......................... | H02H 9/025 361/93.9 |
| 7,957,116 B2 | * | 6/2011 | So .......................... | G05F 1/573 361/93.1 |

(Continued)

FOREIGN PATENT DOCUMENTS

| | | |
|---|---|---|
| JP | 2002-191133 | 7/2002 |
| KR | 1020000001274 A | 1/2000 |

(Continued)

*Primary Examiner* — Sung Cho
(74) *Attorney, Agent, or Firm* — Ward and Smith, P.A.

(57) ABSTRACT

A power supply management circuit manages transfer of power that is supplied to a peripheral device from a power supply device. The power supply management circuit includes a current limiter and one or more capacitors. The current limiter limits intensity of first current received from the power supply device through an input terminal to be smaller than or equal to limitation intensity, and outputs second current having intensity limited to be smaller than or equal to the limitation intensity through an output terminal connected to the peripheral device. When the intensity of the first current exceeds the limitation intensity, the capacitors output third current through the output terminal.

8 Claims, 16 Drawing Sheets

(56) References Cited

U.S. PATENT DOCUMENTS

| | | | |
|---|---|---|---|
| 7,961,546 B2* | 6/2011 | Mair | G11C 5/147 |
| | | | 365/226 |
| 8,699,195 B2 | 4/2014 | So | |
| 9,627,888 B2* | 4/2017 | Ewing | H02J 3/14 |
| 2008/0094865 A1* | 4/2008 | So | G05F 1/56 |
| | | | 363/49 |
| 2009/0024856 A1* | 1/2009 | Lee | G11C 5/143 |
| | | | 713/320 |
| 2009/0108677 A1* | 4/2009 | Walter | H02M 3/1582 |
| | | | 307/80 |
| 2009/0218997 A1* | 9/2009 | Hey | G05F 1/56 |
| | | | 323/273 |
| 2010/0123435 A1 | 5/2010 | Piazza et al. | |
| 2010/0188785 A1 | 7/2010 | Gascuel | |
| 2011/0164598 A1* | 7/2011 | Lee | G06F 1/266 |
| | | | 370/338 |
| 2012/0068538 A1* | 3/2012 | Ye | G06F 1/266 |
| | | | 307/43 |
| 2012/0099392 A1* | 4/2012 | Shim | G11C 16/30 |
| | | | 365/226 |
| 2012/0104994 A1* | 5/2012 | Esnard-Domerego | |
| | | | H02J 7/0068 |
| | | | 320/107 |
| 2012/0139348 A1* | 6/2012 | DuBose | G06F 1/263 |
| | | | 307/80 |
| 2013/0009470 A1* | 1/2013 | Chuang | H02J 7/0065 |
| | | | 307/31 |
| 2013/0270907 A1* | 10/2013 | Heng | H02J 4/00 |
| | | | 307/31 |
| 2013/0278205 A1* | 10/2013 | Mullins | G06F 21/44 |
| | | | 320/107 |
| 2013/0335867 A1 | 12/2013 | Shinde | |
| 2014/0145506 A1 | 5/2014 | Lu et al. | |
| 2014/0195826 A1* | 7/2014 | Wojcik | H05K 5/0086 |
| | | | 713/300 |
| 2014/0310545 A1 | 10/2014 | Xu | |
| 2015/0346792 A1* | 12/2015 | Rathi | G06F 1/266 |
| | | | 713/310 |
| 2016/0320823 A1* | 11/2016 | Gerber | G06F 1/3253 |
| 2016/0330397 A1* | 11/2016 | Wengreen | H04N 5/63 |

FOREIGN PATENT DOCUMENTS

| | | |
|---|---|---|
| KR | 1020060093392 A | 8/2006 |
| KR | 100660938 B1 | 12/2006 |
| KR | 1020120112998 A | 10/2012 |

* cited by examiner

|  | State 1 | State 2 |
|---|---|---|
| Electronic Device 1 | Isup ≤ Ilim | Isup > Ilim |
| Electronic Device 2 | Icon ≤ Ilim (Icon ~ Isup) | Icon = Ilim & Icom (Qcom) |

POWER SUPPLY MANAGEMENT CIRCUIT CONFIGURED TO MANAGE POWER TRANSFER WITH LIMITING CURRENT INTENSITY, AND STORAGE DEVICE AND COMMUNICATION CABLE INCLUDING THE SAME

CROSS-REFERENCE TO RELATED APPLICATIONS

The present application claims priority under 35 U.S.C. § 119 to Korean Patent Application No. 10-2015-0124265 filed on Sep. 2, 2015, in Korean Intellectual Property Office, the entire contents of which are incorporated herein by reference.

TECHNICAL FIELD

The present disclosure relates to electronic circuits, and more particularly, relates to power supply management circuits configured to manage power transfer between electronic devices and an electronic device/component including the same.

DESCRIPTION OF THE RELATED ART

Various kinds of electronic devices are currently being used. Electronic devices may include, for example, mobile communication devices, smart phones, tablets, and/or storage devices, among others. The electronic devices may include various electronic circuits. The electronic device performs its own function(s) according to operations of various electronic circuits included therein. For example, the electronic device may include a processing circuit to perform an operation, a control circuit to control components, a power management circuit to supply and manage power, and the like.

In some cases, electronic devices may be connected to each other for communication. In this case, the electronic devices may exchange information with each other to perform their own functions. Some electronic devices may operate using power supplied from an internal power source. Meanwhile, some electronic devices do not include an internal power source and may not operate without a power supplied from an external power source. For example, an electronic device that does not include an internal power source may be connected with other electronic device(s) that includes an internal power source, and may operate using power supplied from the other electronic device(s).

However, in some cases, power output from an electronic device that includes an internal power source may be unsuitable to operate another electronic device that does not include an internal power source. For example, if power standards for two electronic devices are different from each other or if the amount of power output from an electronic device that includes an internal power source is insufficient to operate another electronic device, a solution to appropriately manage power transfer may be advantageous.

SUMMARY

The example embodiments of the present disclosure may provide a power supply management circuit configured to manage power transfer between a plurality of electronic devices, and an electronic device including the same. The power supply management circuit according to the example embodiments may limit the intensity of current output from an electronic device that includes an internal power source, and may compensate for the current having the limited intensity.

In some example embodiments, a power supply management circuit may manage transfer of power that is supplied to a peripheral device from a power supply device. The power supply management circuit may include a current limiter and one or more capacitors. The current limiter may limit intensity of first current, that is received from the power supply device through an input terminal, to limitation intensity, and may output second current, that has intensity limited to be smaller than or equal to the limitation intensity, through an output terminal connected to the peripheral device. When the intensity of the first current exceeds the limitation intensity, the capacitors may output third current through the output terminal.

In some example embodiments, a storage device may include one or more nonvolatile memories, a memory controller, and a power supply management circuit. The memory controller may control the nonvolatile memories such that write data is stored in the nonvolatile memories or read data is output from the nonvolatile memories. The power supply management circuit may output operation power to at least one of the nonvolatile memories or the memory controller, based on power supplied from an external device. The power supply management circuit may include a current limiter and a capacitive block. The current limiter may limit intensity of first current, that is received from the external device, to be smaller than or equal to limitation intensity, and may output second current that has intensity limited to be smaller than or equal to the limitation intensity. The capacitive block may output third current when the intensity of the first current exceeds the limitation intensity.

In some example embodiments, a communication cable may connect a mobile electronic device and a storage device. The communication cable may include an interface circuit and a power supply management circuit. The interface circuit may process interfacing between the mobile electronic device and the storage device. The power supply management circuit may manage transfer of power that is supplied to the storage device from the mobile electronic device. The power supply management circuit may include a current limiter and a capacitive block. The current limiter may limit intensity of first current, that is received from the mobile electronic device, to be smaller than or equal to limitation intensity, and may output second current, that has intensity limited to be smaller than or equal to the limitation intensity, to the storage device. The capacitive block may output third current to the storage device when the current limiter limits the intensity of the first current to the limitation intensity.

Some embodiments of the present inventive concept include a power supply management circuit that includes a current limiter that is configured to limit a first current received from a power supply device through an input terminal of the power supply management circuit to be smaller than a current limit and to output a second current through an output terminal of the power supply management circuit that is less that the current limit and a capacitor that is configured to output a third current through the output terminal of the power supply management circuit responsive to the first current exceeding the current limit.

In some embodiments, the output terminal of the power supply management circuit is connected to a peripheral device and a voltage of the output terminal is greater than or equal to a minimum operation voltage for operating the peripheral device. Some embodiments provide that a capacitance value of the capacitor is selected based on an amount of current to maintain the voltage of the output terminal at greater than or equal to the minimum operating voltage for operating the peripheral device.

In some embodiments, the peripheral device operates at a first operation state in which a fourth current that is less than or equal to the current limit is consumed or at a second operation state in which a fifth current that is greater than the current limit is consumed and the current limiter and the capacitor are configured to output or not to output the second current and the third current, responsive to whether the peripheral device is operating at the first operational state or the second operational state.

Some embodiments provide that the capacitance value is calculated based on a maximum value of the first current, the current limit, a time length of a limiting operation interval in which the first current is limited by the current limiter, a voltage of the output terminal in an interval other than the limiting operation interval, and a minimum voltage of the output terminal in the limiting operation interval.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other objects, features, and advantages will become apparent from the following description with reference to the following figures, wherein like reference numerals refer to like parts throughout the various figures unless otherwise specified, and wherein.

DETAILED DESCRIPTION

All the above-mentioned features and the following description are provided to help better understanding of the present disclosure. That is, the present disclosure should not be construed as limited to the "example" embodiments set forth herein, and may be embodied in different forms. The following embodiments are merely examples for fully disclosing the present invention, and are described to provide the inventive concepts to those skilled in the art. Therefore, if there are many ways to implement the components of the present disclosure, it is obvious that the present disclosure is implemented with any one of the ways or any one of the similar things thereof.

If it is mentioned that any configuration includes/comprises specific component(s) or any process includes/comprises specific operation(s) in the present disclosure, this means that other component(s) or other operation(s) may be further included. That is, the terms used herein are only intended to describe the specific example embodiments, and is not intended to limit the scope of the present disclosure. Further, the examples described to help better understanding of the present disclosure include their complementary embodiments.

The terms used herein have the meanings in which those skilled in the art would generally understand. The terms commonly used are to be construed as the consistent meanings in the context of the present disclosure. In addition, the terms used herein should not be interpreted as an overly ideal or formal sense unless explicitly so defined herein. Hereinafter, example embodiments of the present disclosure will be described below with reference to the attached drawings.

Figure 1:
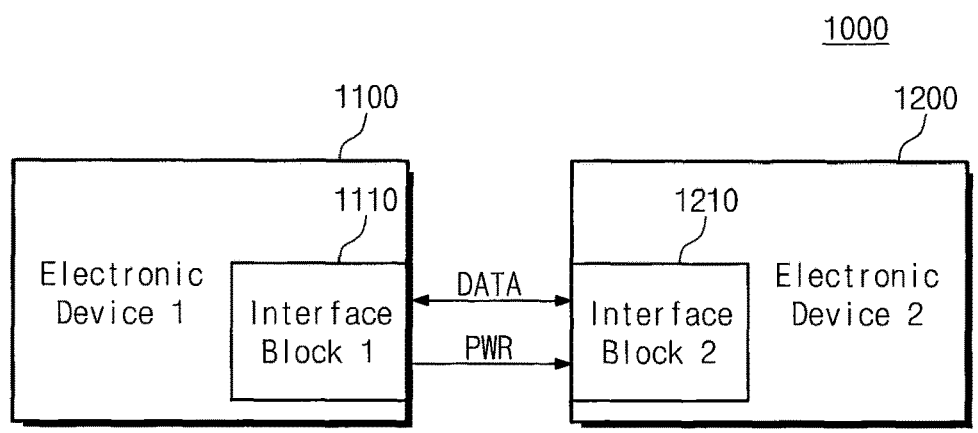
FIG. 1 is a block diagram illustrating an electronic system including electronic devices connected to each other.

FIG. 1 is a block diagram illustrating an electronic system including electronic devices connected to each other.

For example, an electronic system 1000 may include a first electronic device 1100 and a second electronic device 1200. In FIG. 1, it is illustrated that the electronic system 1000 includes two electronic devices 1100 and 1200. However, in some other examples, the electronic system 1000 may include three or more electronic devices that are connected to one another. For brevity, just two electronic devices 1100 and 1200 included in the electronic system 1000 will be described below.

The first electronic device 1100 may include a first interface block 1110. The second electronic device 1200 may include a second interface block 1210. For example, each of the first and second interface blocks 1110 and 1210 may employ one or more of various interface protocols, such as universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), on the go (OTG), Firewire, and/or the like.

The first electronic device 1100 and the second electronic device 1200 may communicate with each other according to interfacing between the first interface block 1110 and the second interface block 1210. The first electronic device 1100 and the second electronic device 1200 may exchange data DATA with each other in compliance with an interface protocol(s) that is employed by the first interface block 1110 and the second interface block 1210.

The first electronic device 1100 may be an electronic device that includes an internal power source. For example, the first electronic device 1100 may be a mobile electronic device such as a portable communication terminal, a portable digital assistant (PDA), a personal media player (PMP), a digital camera, a smart phone, a tablet, a wearable device, and/or the like. In this example, the first electronic device 1100 may include a battery used as a power source, and a power management integrated circuit (PMIC) to manage power supply. The first electronic device 1100 may operate by itself using power supplied from the internal power source.

The second electronic device 1200 may be an electronic device that does not include an internal power source. For example, the second electronic device 1200 may be a peripheral device such as a keyboard, a mouse, a storage device, and/or the like. The second electronic device 1200 may operate using power supplied from an external power source. For example, the second electronic device 1200 may operate using power PWR supplied from the first electronic device 1100 connected thereto.

In the electronic system 1000, the first electronic device 1100 may provide the power PWR to the second electronic device 1200, as well as exchanging the data DATA with the second electronic device 1200. In view of the second electronic device 1200, the first electronic device 1100 may operate as a host device.

The power PWR output from the first electronic device 1100 may be changed or altered, for example, depending on a standard of the interface protocol employed by the first interface block 1110 and/or capability of the first electronic device 1100. For example, the second electronic device 1200 may require different power PWR according to a kind of the second electronic device 1200, an operation characteristic of the second electronic device 1200, and/or a standard of the interface protocol employed by the second interface block 1210.

In some cases, however, the power PWR output from the first electronic device 1100 may be unsuitable for the requirement of the second electronic device 1200. In this case, some problems may occur in power transfer and an operation of the second electronic device 1200. An example problem that may occur in the electronic system 1000 will be described with reference to FIGS. 2 and 3.

Figure 2:
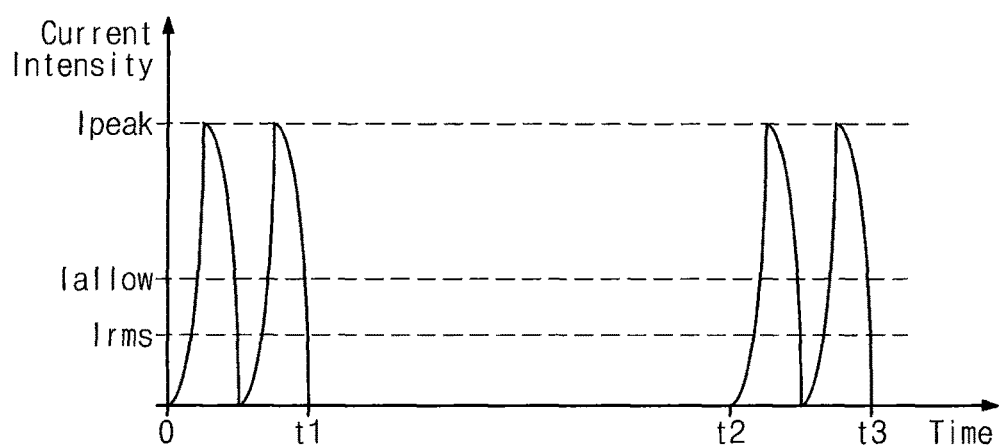
FIG. 2 is a graph illustrating an example characteristic of current that may be consumed by a second electronic device of FIG. 1.

FIG. 2 is a graph illustrating an example characteristic of current that may be consumed by a second electronic device of FIG. 1. To help better understanding, FIG. 1 will be referred together with FIG. 2.

As the first electronic device 1100 supplies the power PWR to the second electronic device 1200, the second electronic device 1200 may consume current provided from the first electronic device 1100. The second electronic device 1200 may perform various operations by means of charges included in the received current.

For example, when the second electronic device 1200 is a flash memory based storage device employing USB 2.0 interface protocol, the second electronic device 1200 may consume current that has a characteristic illustrated in FIG. 2. In detail, the second electronic device 1200 may consume current in a time interval between a time point '0' and a time point 't1', and may not consume current in a time interval between the time point 't1' and a time point 't2'. Afterwards, the second electronic device 1200 may consume current in a time interval between the time point 't2' and a time point 't3', and may not consume current after the time point 't3'.

For example, referring to the time interval between the time point '0' to the time point 't1', the second electronic device 1200 may consume current that has the intensity between zero (0) and peak intensity Ipeak. As used herein, the term "intensity" refers to an amount of electrical current and/or a current value that may be measured in and/or described by Amperes and/or sub-units thereof. Average intensity of the current consumed by the second electronic device 1200 may be expressed by a root-mean square (RMS) value Irms.

For example, current that may be output from the first electronic device 1100 may have allowable intensity Iallow as the maximum intensity. That is, the first electronic device 1100 may not output current having the intensity exceeding the allowable intensity Iallow.

The RMS value Irms of the current consumed by the second electronic device 1200 may not exceed the allowable intensity Iallow. In some cases, however, the second electronic device 1200 may have an operation characteristic where the current that has the peak intensity Ipeak exceeding the allowable intensity Iallow is required. The problem that may occur in such a case will be described with reference to FIG. 3.

Figure 3:
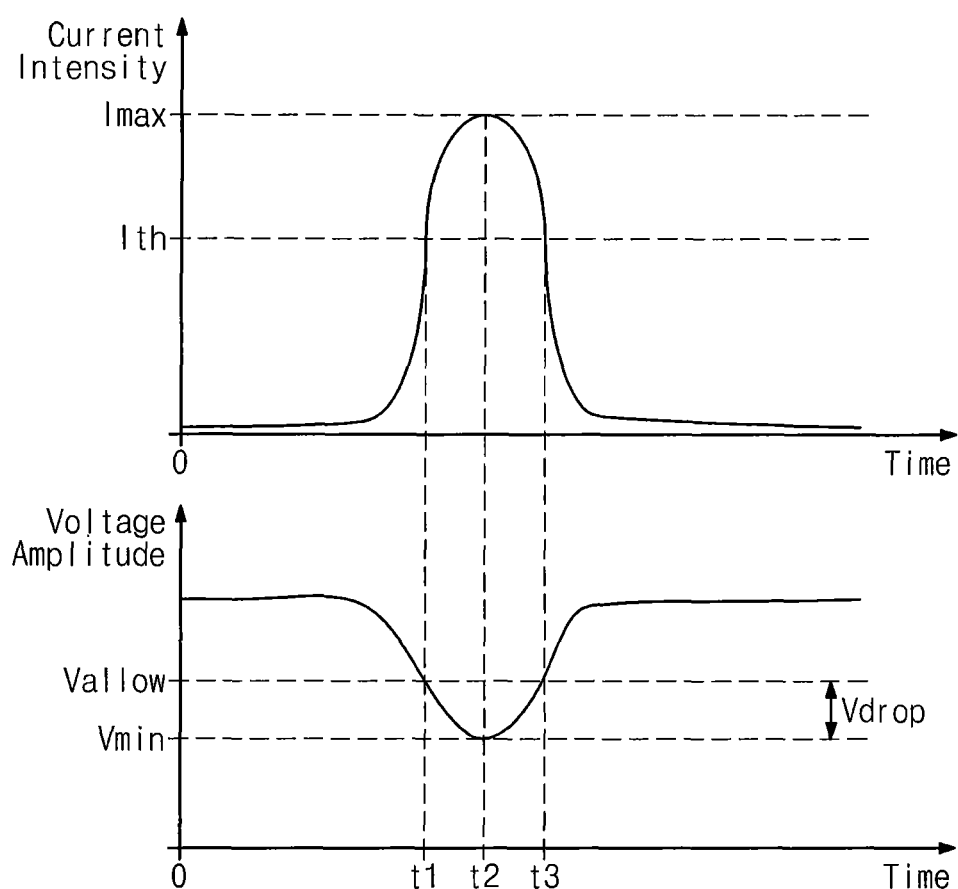
FIG. 3 is a graph illustrating an example characteristic of current output from a first electronic device of FIG. 1 and an example characteristic of an operation voltage applied to a second electronic device of FIG. 1.

FIG. 3 is a graph illustrating an example characteristic of current output from a first electronic device of FIG. 1 and an example characteristic of an operation voltage applied to a second electronic device of FIG. 1. To help better understanding, FIGS. 1 and 2 will be referred together with FIG. 3.

For example, in a time interval between a time point '0' to a time point 't1', when the second electronic device 1200 consumes current having weak intensity, the first electronic device 1100 may output current having intensity weaker than threshold intensity Ith. After the time point 't1', when the second electronic device 1200 consumes current having strong intensity, the first electronic device 1100 may output current having intensity stronger than the threshold intensity Ith. In addition, at a time point 't2', the first electronic device 1100 may output current having the maximum intensity Imax. After a time point 't3', when the second electronic device 1200 consumes current having weak intensity, the first electronic device 1100 may output current having intensity weaker than the threshold intensity Ith.

The amount of power supplied from the first electronic device 1100 is limited. For this reason, when intensity of current output from the first electronic device 1100 increases, an amplitude of an operation voltage applied to the second electronic device 1200 may decrease. This is because the amount of power is proportional to a product of current intensity and a voltage amplitude.

The minimum operation voltage for operating the second electronic device 1200 may have an allowable amplitude Vallow. However, referring to the time interval between the time point 't1' and the time point 't3', when the intensity of the current output from the first electronic device 1100 exceeds the threshold intensity Ith, the amplitude of the operation voltage applied to the second electronic device 1200 may be lowered below the allowable amplitude Vallow. At the time point 't2' where the first electronic device 1100 outputs the current having the maximum intensity Imax, the operation voltage applied to the second electronic device 1200 may have the minimum amplitude Vmin.

An operation voltage corresponding to a section Vdrop between the allowable amplitude Vallow and the minimum amplitude Vmin is applied to the second electronic device 1200, the first electronic device 1100 may not recognize the second electronic device 1200 normally. In the worst case, the operation of the second electronic device 1200 may be interrupted or stopped. These are because the operation voltage applied to the second electronic device 1200 does not reach the minimum operation voltage, thus the operation voltage is insufficient to operate the second electronic device 1200.

To sum up, when the second electronic device 1200 requires current having intensity stronger than the maximum current that may be output from the first electronic device 1100, the operation voltage applied to the second electronic device 1200 may be lowered below the minimum operation voltage. For example, when the second electronic device 1200 instantly consumes strong current having the peak intensity Ipeak as illustrated in FIG. 2, the operation voltage applied to the second electronic device 1200 may instantly drop to the very low amplitude. As a result, some problems may occur in power transfer and the operation of the second electronic device 1200.

In the example embodiments, the intensity of the current output from the first electronic device 1100 may be limited to be smaller than or equal to specific intensity. Accordingly, the operation voltage applied to the second electronic device 1200 may be prevented from being lowered below the minimum operation voltage for the second electronic device 1200. In addition, in the example embodiments, the charges that are lacked due to the current having the limited intensity may be compensated. Accordingly, the interconnected electronic devices 1100 and 1200 may operate stably. Some example embodiments will be described with reference to FIGS. 4 to 19.

Figure 4:
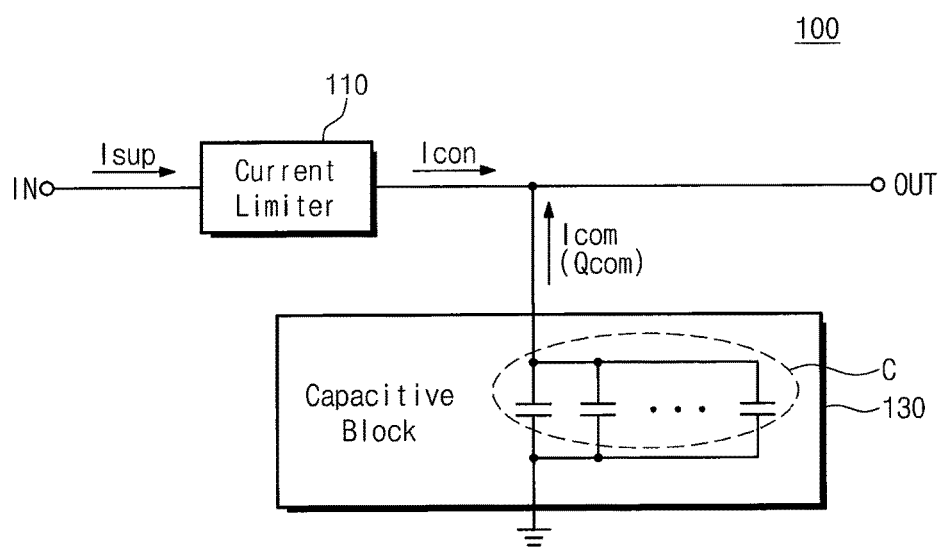
FIG. 4 is a block diagram illustrating a power supply management circuit according to some embodiments of the present inventive concept.

FIG. 4 is a block diagram illustrating a power supply management circuit according to some embodiments of the present inventive concept. A power supply management circuit 100 may include a current limiter 110 and a capacitive block 130. The power supply management circuit 100 may manage transfer of power that is supplied to a peripheral device (e.g., a second electronic device 1200 of FIG. 1) from a power supply device (e.g., a first electronic device 1100 of FIG. 1).

The current limiter 110 may receive first current (hereinafter referred to as "supply current Isup") from the power supply device through an input terminal IN. The current limiter 110 may limit intensity of the supply current Isup to be smaller than or equal to specific intensity (hereinafter referred to as "limitation intensity"). The current limiter 110 may limit the intensity of the supply current Isup, in order to prevent an operation voltage applied to the peripheral device from being lowered below the minimum operation voltage of the peripheral device.

The current limiter 110 may generate second current (hereinafter referred to as "consumption current Icon") by limiting the intensity of the supply current Isup. The consumption current Icon may have intensity that is limited to be smaller than or equal to the limitation intensity. The current limiter 110 may output the consumption current Icon to the peripheral device, in order to operate the peripheral device. The consumption current Icon may be output through an output terminal OUT that is connected to the peripheral device.

Because the current limiter 110 limits the intensity of the supply current Isup output from the power supply device, a voltage of the output terminal OUT may be maintained to be higher than or equal to the minimum operation voltage for operating the peripheral device. Accordingly, the operation voltage applied to the peripheral device may not be dropped below the minimum operation voltage. Herein, the "limitation intensity" associated with the current limiter 110 may be selected to have an appropriate value such that the voltage of the output terminal OUT is not lowered below the minimum operation voltage for operating the peripheral device. For example, the limitation intensity may be selected to have a value that is smaller than or equal to the threshold intensity Ith shown in FIG. 3.

However, because the intensity of the consumption current Icon output from the current limiter 110 is limited to be lower than or equal to the limitation intensity, charges corresponding to a difference between the intensity of the supply current Isup and the limitation intensity may not be provided to the peripheral device if the intensity of the supply current Isup exceeds the limitation intensity. Thus, the peripheral device may not be supplied with sufficient charges. The capacitive block 130 may be provided to compensate for the charges that are not supplied to the peripheral device due to limiting the intensity of the consumption current Icon.

The capacitive block 130 may output third current (hereinafter referred to as "compensation current Icom") through the output terminal OUT. When the intensity of the supply current Isup exceeds the limitation intensity, the current limiter 110 may limit the intensity of the supply current Isup to the limitation intensity and may output the consumption current Icon having the limitation intensity. In this case, the capacitive block 130 may output the compensation current Icom to compensate for the charges that are not supplied to the peripheral device. The compensation current Icom may compensate for the consumption current Icon that is limited to have the limitation intensity, such that the peripheral device may receive current having intensity exceeding the limitation intensity. Charges may be provided to the peripheral device as much as a compensation charge amount Qcom when the compensation current Icom is output during a specific time interval. Accordingly, the peripheral device may operate based on the consumption current Icon and the compensation current Icom.

For example, the capacitive block 130 may include one or more capacitors C. The capacitors C may store charges in response to variation on the voltage of the output terminal OUT. The charges stored in the capacitors C may be output from the capacitive block 130 as the compensation current Icom. However, this example is not intended to limit the present disclosure, and the present disclosure may be variously changed or modified. The capacitive block 130 may have any other configuration(s) to store charges and to compensate for current/charges.

A capacitance value of the capacitive block 130 may be selected considering the amount of the charges that are not supplied to the peripheral device due to the limited intensity of the consumption current Icon. The capacitive block 130 may have a capacitance value that is sufficient to compensate for the charges not being supplied to the peripheral device. The procedure of selecting the capacitance value of the capacitive block 130 will be described with reference to FIGS. 10 to 12.

When the intensity of the supply current Isup is smaller than or equal to the limitation intensity, the current limiter 110 may output the consumption current Icon without limiting the intensity of the supply current Isup. In this case, for example, the capacitive block 130 may not output the compensation current Icom. Accordingly, the peripheral device may operate based on the consumption current Icon.

The power supply management circuit 100 according to some embodiments may be included in an electronic device or may be implemented separately from an electronic device. The implementation of the power supply management circuit 100 may be variously changed or modified. Below, some example embodiments for implementing the power supply management circuit 100 will be described.

Figure 5:
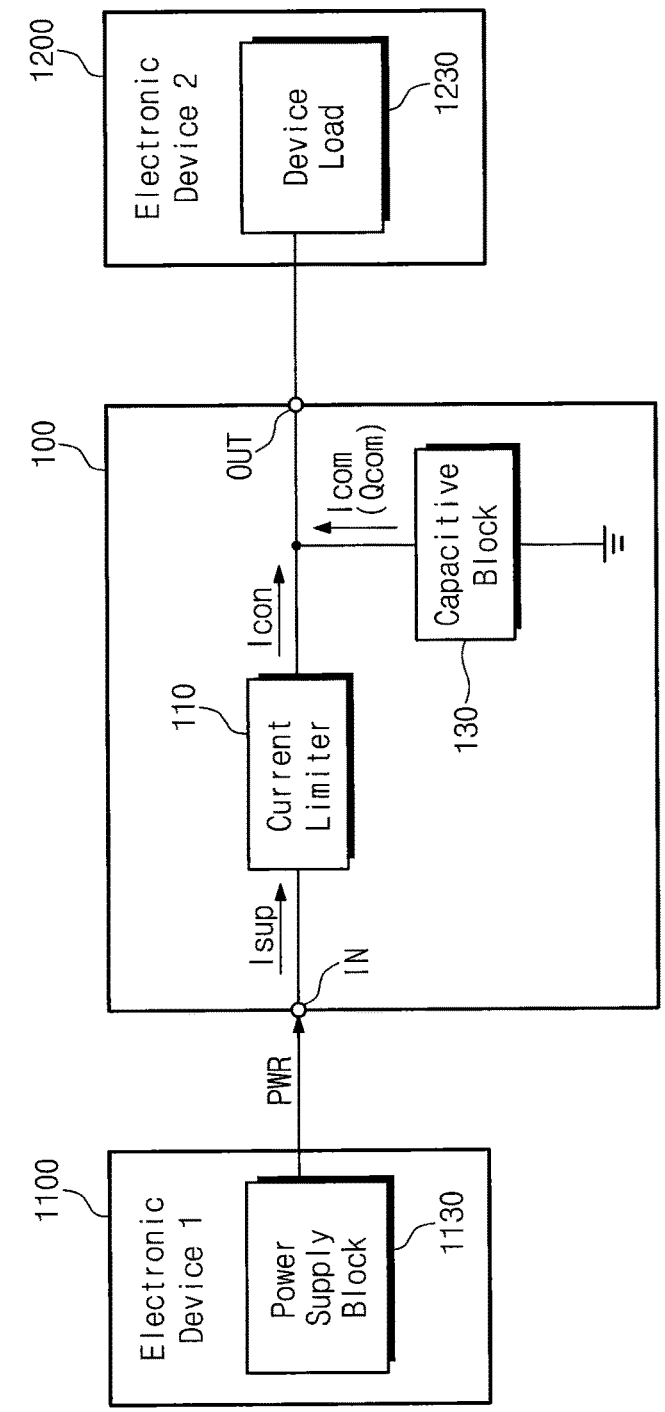
FIG. 5 is a block diagram illustrating an electronic system including electronic devices connected through a power supply management circuit of FIG. 4.

FIG. 5 is a block diagram illustrating an electronic system including electronic devices connected through a power supply management circuit of FIG. 4. An electronic system 2000 may include a first electronic device 1100 and a second electronic device 1200. The first electronic device 1100 and the second electronic device 1200 may be connected to each other through a power supply management circuit 100.

Configurations and operations of the first electronic device 1100 and the second electronic device 1200 have been described with reference to FIG. 1. In addition, configurations and operations of a current limiter 110 and a capacitive block 130 included in the power supply management circuit 100 have been described with reference to FIG. 4. For brevity, redundant descriptions associated with the first electronic device 1100, the second electronic device 1200, and the power supply management circuit 100 will be omitted below.

For example, the first electronic device 1100 may include a power supply block 1130. The power supply block 1130 may be provided as an internal power source of the first electronic device 1100. For example, the power supply block 1130 may include a battery used as a power source of the first electronic device 1100, and a PMIC for managing supply of the power.

For example, the second electronic device 1200 may include a device load 1230. The device load 1230 may have impedance of the second electronic device 1200 that is recognized at the outside of the second electronic device 1200. A configuration of the device load 1230 may be changed or altered according to a kind and a function of the second electronic device 1200. For example, if the second electronic device 1200 is a storage device, the device load 1230 may be configured to include a memory for storing data and a controller for controlling the memory.

Unlike the first electronic device 1100, the second electronic device 1200 may not include an internal power source. The second electronic device 1200 may operate using power PWR supplied from the first electronic device 1100. In some example embodiments, the power PWR output from the first electronic device 1100 may be supplied to the second electronic device 1200 through the power supply management circuit 100. In detail, the device load 1230 may be supplied with the power PWR output from the power supply block 1130 through the power supply management circuit 100. The device load 1230 may perform its own function by means of the supplied power PWR.

In some cases, the device load 1230 may require current having intensity stronger than the maximum current that may be output from the first electronic device 1100, as illustrated in FIG. 2. The current limiter 110 may limit the intensity of supply current Isup output from the first electronic device 1100. In addition, the current limiter 110 may provide the device load 1230 with consumption current Icon having the limited intensity. The capacitive block 130 may output compensation current Icom to compensate for charges that are lacked due to the consumption current Icon having the limited intensity.

According to such an example embodiments, a voltage of an output terminal OUT may be maintained to be higher than or equal to the minimum operation voltage for the second electronic device 1200. Accordingly, even though the device load 1230 instantly consumes strong current, the second electronic device 1200 may normally operate and the first electronic device 1100 may recognize the second electronic device 1200 normally. Of course, the electronic system 2000 may normally operate when the device load 1230 consumes current having intensity smaller than or equal to the maximum intensity that may be output from the first electronic device 1100.

Figures 6, 7:
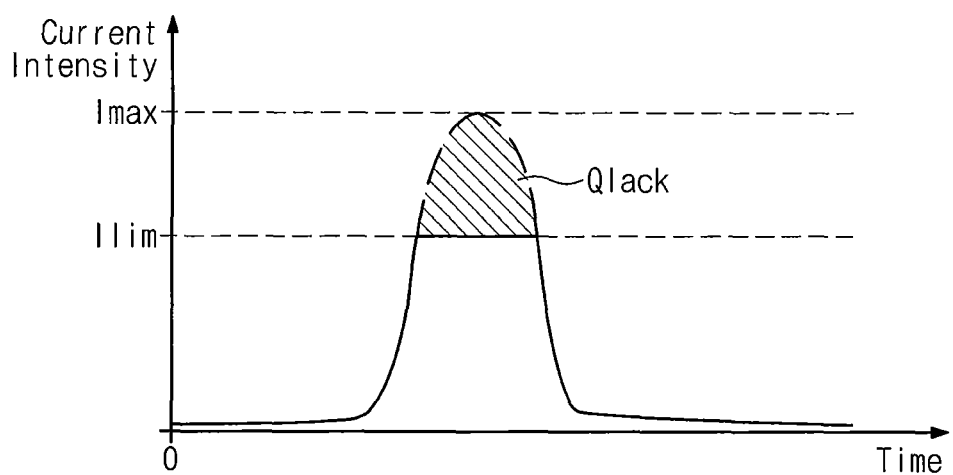
FIG. 6 is a graph illustrating consumption current having intensity limited by a current limiter of FIG. 5.
FIG. 7 is a table describing operation states of electronic devices of FIG. 5.

FIG. 6 is a graph illustrating consumption current having intensity limited by a current limiter of FIG. 5. To help better understanding, FIG. 5 will be referred together with FIG. 6.

Consumption current Icon may have the maximum intensity Imax when a power supply management circuit 100 including a current limiter 110 is not provided. However, when the intensity of the consumption current Icon increases up to the maximum intensity Imax, as described above, a voltage of an output terminal OUT may be lowered below the minimum operation voltage for operating a second electronic device 1200. To avoid this situation, the current limiter 110 may generate the consumption current Icon by limiting intensity of supply current Isup to be smaller than or equal to limitation intensity Ilim.

The consumption current Icon may have the intensity that is limited to be smaller than or equal to the limitation intensity Ilim. For example, when the supply current Isup has intensity exceeding the limitation intensity Ilim, the intensity of the consumption current Icon may be limited to the limitation intensity Ilim. Meanwhile, when the supply current Isup has intensity smaller than or equal to the limitation intensity Ilim, the consumption current Icon may have the same or substantially the same intensity as the supply current Isup.

When the intensity of the consumption current Icon is limited to the limitation intensity Ilim as the intensity of the supply current Isup exceeds the limitation intensity Ilim, charges corresponding to a difference between the intensity of the supply current Isup and the limitation intensity Ilim may not be provided to the second electronic device 1200. That is, charges may not be provided to the second electronic device 1200 as much as a charge amount Qlack that is lacked due to the consumption current Icon having the limited intensity. To avoid this situation, a capacitive block 130 may be provided to sufficiently compensate for the charges as much as the lacked charge amount Qlack.

FIG. 7 is a table describing operation states of electronic devices of FIG. 5. To help better understanding, FIGS. 5 and 6 will be referred together with FIG. 7.

In some example embodiments, electronic devices 1100 and 1200 may operate at a first operation state or a second operation state. The first operation state may be a state where the second electronic device 1200 consumes current having intensity smaller than or equal to limitation intensity Ilim. On the other hand, the second operation state may be a state where the second electronic device 1200 requires current having intensity exceeding the limitation intensity Ilim.

At the first operation state, the first electronic device 1100 may output supply current Isup having intensity smaller than or equal to the limitation intensity Ilim. The supply current Isup may be provided to the second electronic device 1200 as consumption current Icon without being limited by a current limiter 110. The consumption current Icon may have intensity that is the same or substantially the same as the supply current Isup. In some cases, a capacitive block 130 may not output current at the first operation state.

At the second operation state, the first electronic device 1100 may output the supply current Isup having intensity exceeding the limitation intensity Ilim. However, the current limiter 110 may output the consumption current Icon by limiting the intensity of the supply current Isup to the limitation intensity Ilim. Accordingly, the consumption current Icon may have the limitation intensity Ilim. In addition, the capacitive block 130 may output compensation current Icom including charges as much as a compensation charge amount Qcom.

The capacitive block 130 may be configured such that the compensation charge amount Qcom sufficiently compensates for a charge amount Qlack that is lacked due to the consumption current Icon having the limited intensity. The compensation current Icom may compensate for a difference between the limitation intensity Ilim and intensity of current required by the second electronic device 1200. Accordingly, the second electronic device 1200 may receive sufficient charges based on current having intensity exceeding the limitation intensity Ilim.

Figure 8:
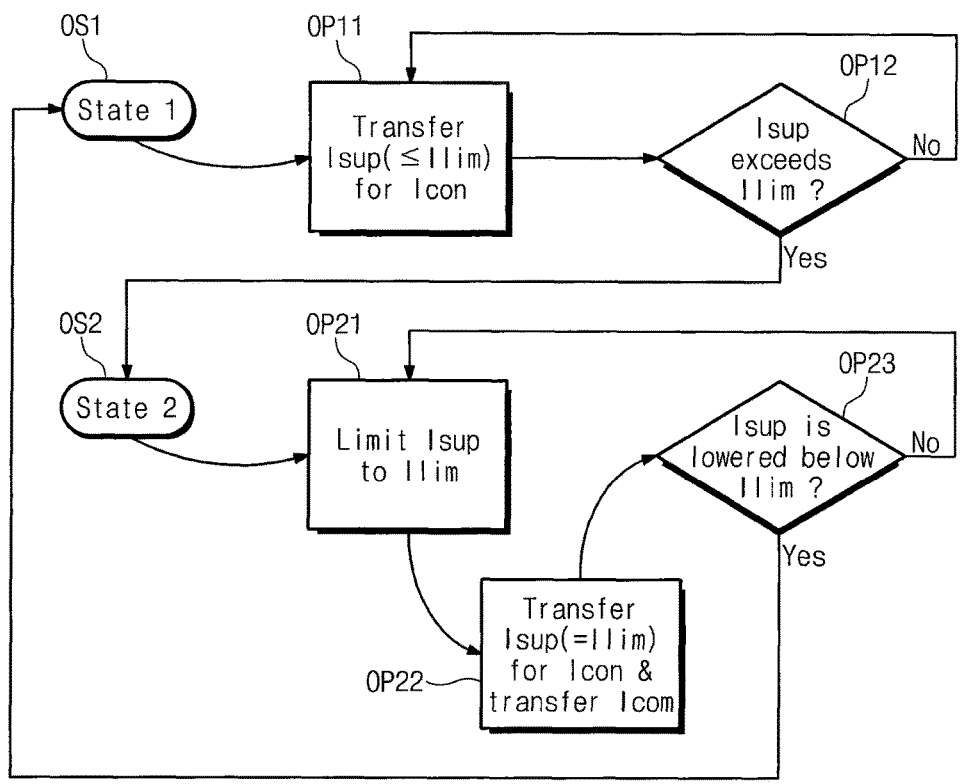
FIG. 8 is a state diagram describing operations of a power supply management circuit of FIG. 5.

FIG. 8 is a state diagram describing operations of a power supply management circuit of FIG. 5. To help better understanding, FIGS. 5 and 6 will be referred together with FIG. 8.

In some example embodiments, a power supply management circuit 100 may operate at a first operation state OS1 or a second operation state OS2. The first operation state OS1 may be a state where a second electronic device 1200 consumes current having intensity smaller than or equal to limitation intensity Ilim. On the other hand, the second operation state OS2 may be a state where the second electronic device 1200 requires current having intensity exceeding the limitation intensity Ilim.

First, at the first operation state OS1, the power supply management circuit 100 may transfer supply current Isup to the second electronic device 1200 from a first electronic device 1100 as consumption current Icon (OP11). As described above, at the first operation state OS1, the supply current Isup may have intensity smaller than or equal to the limitation intensity Ilim and the consumption current Icon may have the same or substantially the same intensity as the supply current Isup.

When the intensity of the supply current Isup does not exceed the limitation intensity Ilim (i.e., when the electronic devices 1100 and 1200 continuously operate at the first operation state OS1), the power supply management circuit 100 may output the consumption current Icon having intensity smaller than or equal to the limitation intensity Ilim. On the other hand, when the intensity of the supply current Isup exceeds the limitation intensity Ilim (i.e., when the second electronic device 1200 requires current having intensity exceeding the limitation intensity Ilim), the power supply management circuit 100 may transition to the second operation state OS2 (OP12).

At the second operation state OS2, the power supply management circuit 100 may limit the intensity of the supply current Isup to the limitation intensity Ilim by a current limiter 110 (OP21). Accordingly, the power supply management circuit 100 may transfer the supply current Isup that is limited to have the limitation intensity Ilim to the second electronic device 1200 from the first electronic device 1100 as the consumption current Icon (OP22). In addition, the power supply management circuit 100 may transfer compensation current Icom to the second electronic device 1200 by a capacitive block 130 (OP22).

When the intensity of the supply current Isup is not lowered being smaller than or equal to the limitation intensity Ilim (i.e., when the electronic devices 1100 and 1200 continuously operate at the second operation state OS2), the power supply management circuit 100 may output the consumption current Icon having the limitation intensity Ilim and the consumption current Icom corresponding to a compensation charge amount Qcom (OP21 and OP22). On the other hand, when the intensity of the supply current Isup is lowered being smaller than or equal to the limitation intensity Ilim (i.e., when the second electronic device 1200 consumes current having intensity smaller than or equal to the limitation intensity Ilim), the power supply management circuit 100 may transition to the first operation state OS1 (OP23).

Figure 9A:
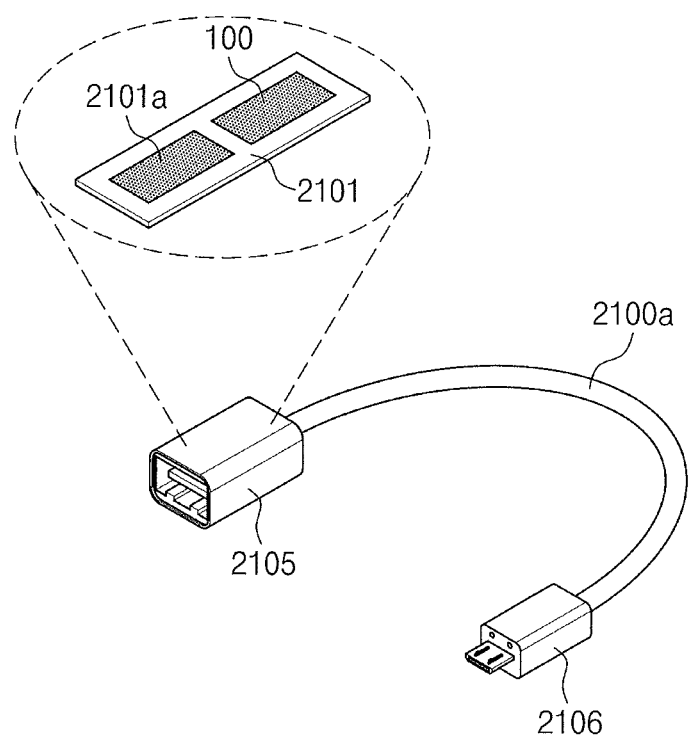
FIG. 9A is a conceptual diagram illustrating a communication cable including a power supply management circuit of FIG. 4.

FIG. 9A is a conceptual diagram illustrating a communication cable including a power supply management circuit of FIG. 4. To help better understanding, FIGS. 4 and 5 will be referred together with FIG. 9A.

For example, a communication cable 2100a may connect a first electronic device 1100 and a second electronic device 1200. A first terminal 2105 of the communication cable 2100a may be connected to the first electronic device 1100, and a second terminal 2106 thereof may be connected to the second electronic device 1200. The first electronic device 1100 and the second electronic device 1200 may communicate with each other through the communication cable 2100a.

For example, the communication cable 2100a may include a printed circuit board 2101. The printed circuit board 2101 may include components that allow the first electronic device 1100 and the second electronic device 1200 to communicate with each other.

For example, an interface circuit 2101a may be implemented on the printed circuit board 2101. The interface circuit 2101a may process interfacing between the first electronic device 1100 and the second electronic device 1200. For example, the interface circuit 2101a may perform translation between interface protocols respectively employed by the first electronic device 1100 and the second electronic device 1200. For example, the interface circuit 2101a may appropriately manage exchanging data between the first electronic device 1100 and the second electronic device 1200.

In some example embodiments, a power supply management circuit 100 may be implemented on the printed circuit board 2101. That is, the power supply management circuit 10Q may be implemented to be included in the communication cable 2100a for an electronic system 2000. The power supply management circuit 100 may manage transfer of power supplied to the second electronic device 1200 from the first electronic device 1100.

The power supply management circuit 100 may limit intensity of supply current Isup received from the first electronic device 1100 to be smaller than or equal to limitation intensity by a current limiter 110. The power supply management circuit 100 may output consumption current Icon that has intensity limited to be smaller than or equal to the limitation intensity to the second electronic device 1200. Accordingly, a voltage of a node (e.g., an output terminal OUT) connecting the power supply management circuit 100 to the second electronic device 1200 may be maintained to be larger than or equal to the minimum operation voltage for operating the second electronic device 1200. In addition, when the current limiter 110 limits the intensity of the supply current Isup to the limitation intensity, the power supply management circuit 100 may output compensation current Icom to the second electronic device 1200 by a capacitive block 130.

Configurations and operations of the power supply management circuit 100 have been described with reference to FIGS. 4 to 8. For brevity, redundant descriptions associated with the power supply management circuit 100 will be omitted below.

As illustrated in FIG. 9A, the power supply management circuit 100 may be provided separately from the electronic devices 1100 and 1200. In these example embodiments, the power supply management circuit 100 may be implemented without changing the previous designs of the electronic devices 1100 and 1200.

Figure 9B:
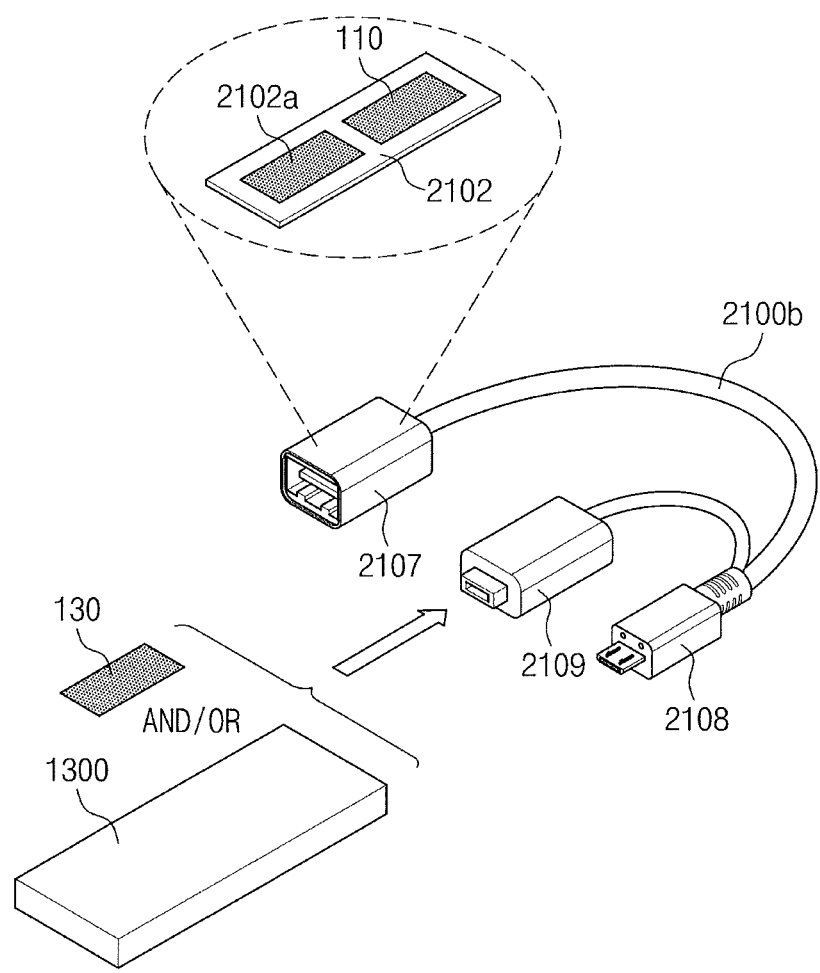
FIG. 9B is a conceptual diagram illustrating another communication cable implemented to be different from a communication cable of FIG. 9A.

FIG. 9B is a conceptual diagram illustrating another communication cable implemented to be different from a communication cable of FIG. 9A. To help better understanding, FIGS. 4 and 5 will be referred together with FIG. 9B.

Unlike a communication cable 2100a of FIG. 9A, a communication cable 2100b may include three terminals. A first terminal 2107 of the communication cable 2100b may be connected to a first electronic device 1100, and a second terminal 2108 thereof may be connected to a second electronic device 1200. The first electronic device 1100 and the second electronic device 1200 may communicate with each other through the communication cable 2100b.

In addition, a third terminal 2109 of the communication cable 2100b may be connected with a power supply circuit or device. The first electronic device 1100 and/or the second electronic device 1200 may receive power from the power supply circuit or device connected through the third terminal 2109 of the communication cable 2100b. For example, the power supply circuit or device may include an auxiliary battery or a charger circuit/device.

For example, the communication cable 2100b may include a printed circuit board 2102. The printed circuit board 2102 may include components that allow the first electronic device 1100 and the second electronic device 1200 to communicate with each other. For example, an interface circuit 2102a may be implemented on the printed circuit board 2101. Configurations and functions of the interface circuit 2102a may include configurations and operations of the interface circuit 2101a of FIG. 9A. For brevity, redundant descriptions associated with the interface circuit 2102a will be omitted below.

In some example embodiments, a current limiter 110 may be implemented on the printed circuit board 2102. In such example embodiments, a capacitive block 130 may be connected to the third terminal of the capacitive block 2100b. As will be described with reference to FIG. 19, in some example embodiments, the current limiter 110 and the capacitive block 130 of the power supply management circuit 100 may be separately provided. In the example embodiments of FIG. 9B, the current limiter 110 and the capacitive block 130 may be separately provided, and the third terminal 2109 of the communication cable 2100b may be used for the connection with the capacitive block 130.

Even though the current limiter 110 and the capacitive block 130 are provided separately, the current limiter 110 and the capacitive block 130 may operate the same as or to be similar to those as described above. The current limiter 110 may limit intensity of supply current Isup provided from the first electronic device 1100 to limitation intensity. Accordingly, the second electronic device 1200 may operate using an operation voltage larger than or equal to the minimum operation voltage. In addition, when the current limiter 110 limits the intensity of the supply current Isup to be smaller than or equal to the limitation intensity, the capacitive block 130 may output compensation current Icom to the second electronic device 1200.

In some example embodiments, an external power supply device 1300, instead of the capacitive block 130, may be connected to the third terminal 2109 of the communication cable 2100b. The external power supply device 1300 may include, for example, a power supply device such as a rechargeable portable external power source (e.g., an auxiliary battery). In such example embodiments, the external power supply device 1300 may be employed, instead of the capacitive block 130, to provide the compensation current Icom to the second electronic device 1200. In some cases, both the capacitive block 130 and the external power supply device 1300 may be connected to the third terminal 2109 of the communication cable 2100b.

Figure 10:
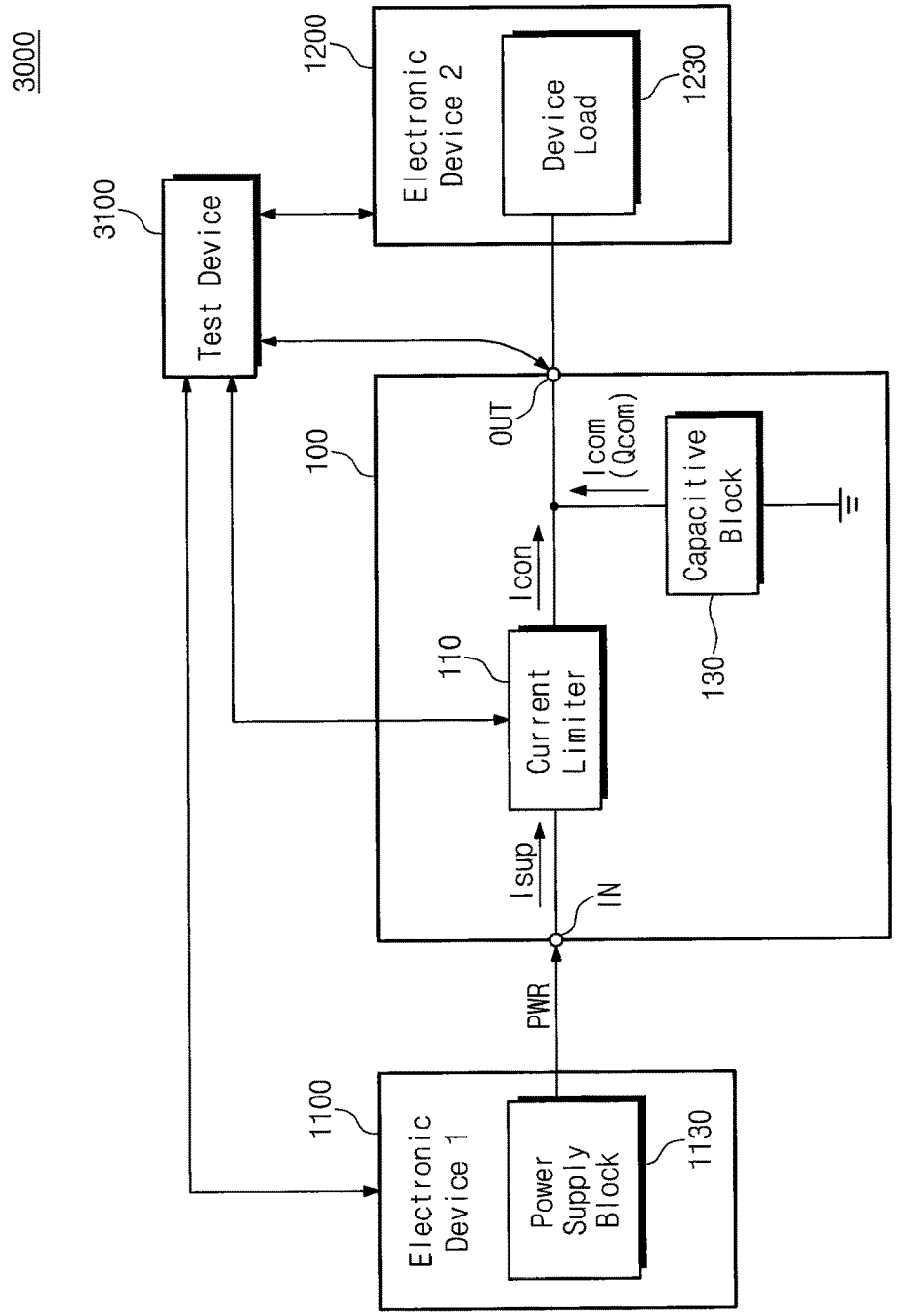
FIG. 10 is a block diagram illustrating a test system that is used to design a power supply management circuit according to some embodiments of the present inventive concept.

FIG. 10 is a block diagram illustrating a test system that is used to design a power supply management circuit according to some example embodiments. A test system 3000 may include electronic devices 1100 and 1200 and a power supply management circuit 100 to connect the electronic devices 1100 and 1200. The test system 3000 may further include a test device 3100.

Configurations and operations of the first electronic device 1100, the second electronic device 1200, and the power supply management circuit 100 have been described with reference to FIGS. 4 to 8. For brevity, redundant descriptions associated with the first electronic device 1100, the second electronic device 1200, and the power supply management circuit 100 will be omitted below.

The test device 3100 may be provided to design the power supply management circuit 100. For example, in the test system 3000, the first electronic device 1100, the second electronic device 1200, and the power supply management circuit 100 may perform general operations. The test device 3100 may collect a variety of information during a test operation where the first electronic device 1100, the second electronic device 1200, and the power supply management circuit 100 are operating. For example, the test device 3100 may collect information associated with current output from the first electronic device 1100 and information associated with a status of an output terminal OUT. However, the present disclosure is not limited thereto, and the test device 3100 may further collect any other information.

For example, the test device 3100 may perform various operations to select a capacitance value of a capacitive block 130. As described above, the capacitive block 130 may have a capacitance value that is sufficient to compensate for a charge amount Qlack lacked due to the consumption current Icon having the limited intensity. Based on the collected information, the test device 3100 may be used to calculate the lacked charge amount Qlack and an appropriate capacitance value for the capacitive block 130.

An end-user of the power supply management circuit 100 may use the power supply management circuit 100 that includes the capacitive block 130 having the capacitance value calculated by the test device 3100. An example procedure of determining the capacitance value of the capacitive block 130 will be described with reference to FIGS. 11 to 12.

The test device 3100 may be a computing device including one or more processor cores for processing operations. For example, the test device 3100 may be a general-purpose computing device such as a personal computer. In some embodiments, the test device 3100 may be a special-purposed computing device provided to design the power supply management circuit 100.

Figure 11:
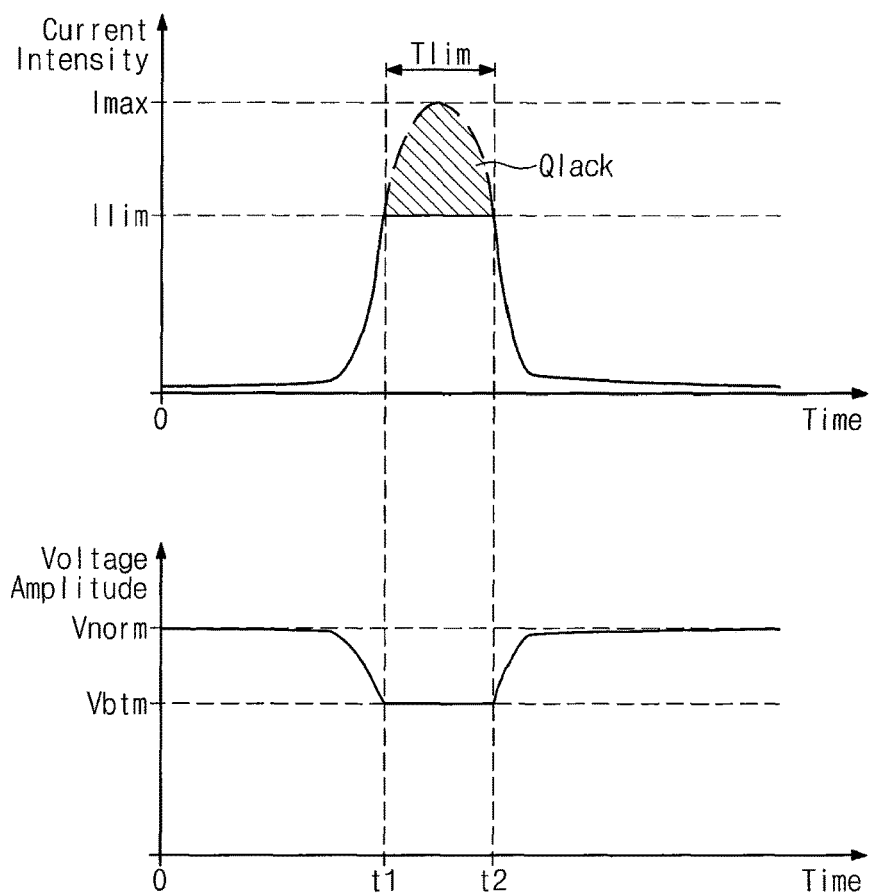
FIG. 11 is a graph for describing a charge amount that is lacked due to consumption current having intensity limited by a current limiter of FIG. 10.
Figure 12:
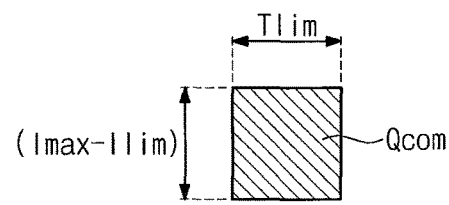
FIG. 12 is a conceptual diagram for describing the procedure of calculating a capacitance value of a capacitive block of FIG. 10 to compensate for a lacked charge amount of FIG. 11.

FIG. 11 is a graph for describing a charge amount that is lacked due to consumption current having intensity limited by a current limiter of FIG. 10. FIG. 12 is a conceptual diagram for describing the procedure of calculating a capacitance value of a capacitive block of FIG. 10 to compensate for a lacked charge amount of FIG. 11. To help better understanding, FIG. 10 will be referred together with FIGS. 11 and 12.

Referring to FIG. 11 first, if a power supply management circuit 100 is not provided, intensity of current provided to a second electronic device 1200 from a first electronic device 1100 may increase up to the maximum intensity Imax. However, in the example embodiments, the power supply management circuit 100 may generate consumption current Icon by limiting supply current Isup to limitation intensity Ilim. For example, between a time point 't1' and a time point 't2', there may be a limiting operation interval Tlim where the intensity of the supply current Isup is limited by the current limiter 110.

In a time interval(s) other than the limiting operation interval Tlim, a voltage of an output terminal OUT may have an amplitude between a normal amplitude Vnorm and a bottom amplitude Vbtm. In the limiting operation interval Tlim, the voltage of the output terminal OUT may have the bottom amplitude Vbtm. The bottom amplitude Vbtm may be the minimum amplitude of the voltage applied to the output terminal OUT when the intensity of the supply current Isup is limited to the limitation intensity Ilim. The limitation intensity Ilim may be selected such that the bottom amplitude Vbtm is larger than or equal to an amplitude of the minimum operation voltage for operating the second electronic device 1200. Accordingly, an operation voltage applied to the second electronic device 1200 may be maintained to be greater than or equal to the minimum operation voltage.

However, as described above, the second electronic device 1200 may not receive sufficient charge based on the charge amount Qlack that is unavailable due to the consumption current Icon having limited intensity. It may be understood from the following equation 1 that limiting the intensity of current causes a charge amount to be reduced.

$$i = \frac{dq}{dt} \Leftrightarrow q = \int i\,dt,\qquad \text{[Equation 1]}$$

Accordingly, in the example embodiments, an amount of charge corresponding to the lacked charge amount Qlack may be compensated to operate the second electronic device 1200 appropriately. The lacked charge amount Qlack may be calculated based on the following equation 2.

$$Q\text{lack} = \int_{t1}^{t2} I\text{sup}\,dt\qquad \text{[Equation 2]}$$

However, it may be impossible to continuously track the intensity of the supply current Isup during the limiting operation interval Tlim between the time point 't1' and the time point 't2'. Accordingly, it may be difficult for a test device 3100 to precisely calculate the lacked charge amount Qlack. For this reason, the example embodiments may provide methods of appropriately calculating a compensation charge amount Qcom for compensating for the lacked charge amount Qlack.

Referring to FIG. 12, a square may indicate the compensation charge amount Qcom. An area of the square in FIG. 12 may correspond to the compensation charge amount Qcom that is to be compensated by a capacitive block 130. The area of the square in FIG. 12 may be obtained by a product of a difference between the maximum intensity Imax and the limitation intensity Ilim (i.e., Imax−Ilim) and a time length of the limiting operation interval Tlim. That is, the compensation charge amount Qcom may be calculated based on the following equation 3.

$$Q\text{com} = (I\text{max} - I\text{lim}) \times T\text{lim}\qquad \text{[Equation 3]}$$

The test device 3100 may collect information associated with the maximum intensity Imax of the supply current Isup, the limitation intensity Ilim, and the time length of the limiting operation interval Tlim, during a test operation of the test system 3000. Collecting these information may be easier than continuously tracking the intensity of the supply current Isup during the limiting operation interval Tlim. The test device 3100 may determine a capacitance value of the capacitive block 130 based on the collected information, which will be described later.

Comparing the lacked charge amount Qlack of FIG. 11 to the compensation charge amount Qcom of FIG. 12, it may be understood that the compensation charge amount Qcom is larger than the lacked charge amount Qlack. In this case, since the compensation charge amount Qcom is sufficient to compensate for the lacked charge amount Qlack, there may be no problem in an operation of the power supply management circuit 100. It may be advantageous to calculate the compensation charge amount Qcom, rather than to precisely calculate the lacked charge amount Qlack, in order to simplify the calculation.

As described above, the capacitive block 130 may compensate for the charges as much as the compensation charge amount Qcom by outputting the compensation current Icom. The following equation 4 may be obtained if "Cb" indicates the capacitance value of the capacitive block 130 and "v" indicates the voltage of the output terminal OUT.

$$Q\text{com} = \int_{V\text{btm}}^{V\text{norm}} (Cb \times v)\,dv\qquad \text{[Equation 4]}$$

The following equation 5 may be obtained by calculating the equation 4.

$$Q\text{com} = \tfrac{1}{2} Cb(V\text{norm}^2 - V\text{btm}^2)\qquad \text{[Equation 5]}$$

The test device 3100 may collect information associated with the normal amplitude Vnorm and the bottom amplitude Vbtm of the voltage of the output terminal OUT during the test operation of the test system 3000. To this end, for example, the test device 3100 may include a current meter, a voltage meter, and some memory devices for storing the collected information.

The capacitance value Cb of the capacitive block 130 may be obtained, as expressed by the following equation 6, using the right side of the equation 3 and the right side of the equation 5.

$$Cb = \frac{2\ Tlim(Imax - Ilim)}{Vnorm^2 - Vbtm^2} \quad \text{[Equation 6]}$$

That is, the capacitance value Cb of the capacitive block 130 may be calculated based on the maximum intensity Imax of the supply current Isup, the limitation intensity Ilim, the time length of the limiting operation interval Tlim, the minimum amplitude Vbtm of the voltage of the output terminal OUT in the limiting operation interval Tlim, and the normal amplitude Vnorm of the voltage of the output terminal OUT in the interval(s) other than the limiting operation interval Tlim. The test device 3100 may calculate an appropriate capacitance value of the capacitive block 130 based on the information collected during the test operation of the test system 3000. The power supply management circuit 100 may be designed using the calculated capacitance value. The calculated capacitance value may allow the capacitive block 130 to compensate for the charges as much as the compensation charge amount Qcom, and the compensation charge amount Qcom may be sufficient to compensate for the lacked charge amount Qlack.

However, the procedures described with reference to FIGS. 11 and 12 may be only examples to obtain the capacitance value of the capacitive block 130. The present disclosure is not limited by the procedures described with reference to FIGS. 11 and 12. The capacitance value of the capacitive block 130 may be obtained according to various methods so as to sufficiently compensate for the lacked charge amount Qlack.

Figure 13:
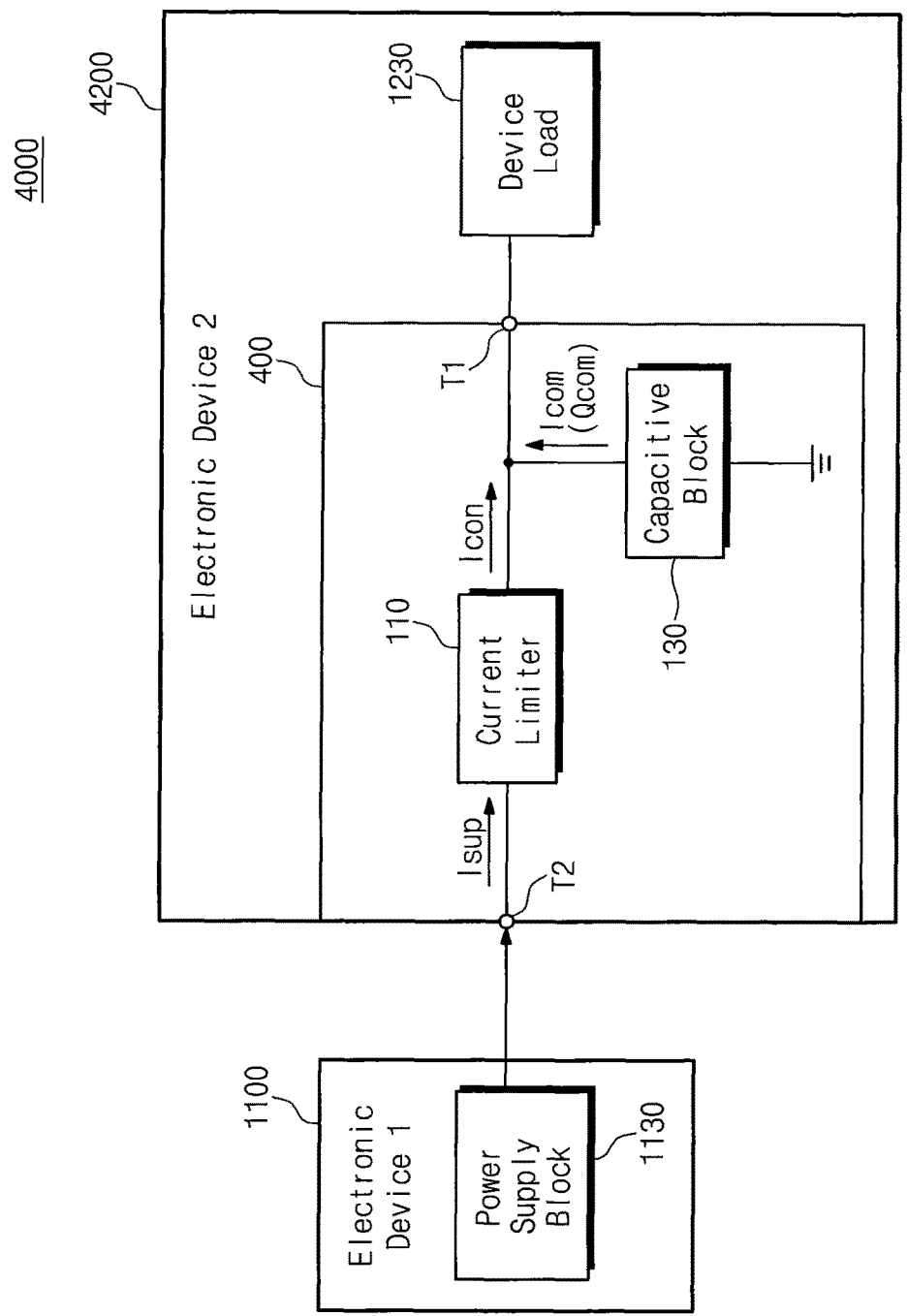
FIG. 13 is a block diagram illustrating an electronic system including a second electronic device that includes a power supply management circuit according to some embodiments of the present inventive concept.

FIG. 13 is a block diagram illustrating an electronic system including a second electronic device that includes a power supply management circuit according to some embodiments of the present inventive concept. An electronic system 4000 may include a first electronic device 1100 and a second electronic device 4200.

Configurations and operations of the first electronic device 1100 have been described with reference to FIGS. 1 and 5. The second electronic device 4200 may be configured and may operate similarly to a second electronic device 1200 described with reference to FIGS. 1 and 5. For brevity, redundant descriptions associated with the first electronic device 1100 and the second electronic device 4200 will be omitted below.

Unlike example embodiments described with reference to FIG. 5, the second electronic device 4200 may include a power supply management circuit 400. That is, in the example embodiments of FIG. 13, the power supply management circuit 400 may be included in the second electronic device 4200, rather than being separately provided from the electronic devices 1100 and 4200. The power supply management circuit 400 may include a current limiter 110 and a capacitive block 130.

The current limiter 110 may receive supply current Isup from the first electronic device 1100. The current limiter 110 may limit intensity of the supply current Isup to be smaller than or equal to limitation intensity. The current limiter 110 may provide a device load 1230 with consumption current Icon having intensity limited to be smaller than or equal to the limitation intensity. Accordingly, a voltage of a terminal T1 connecting the power supply management circuit 400 to the device load 1230 may be maintained to be greater than or equal to the minimum operation voltage for operating the second electronic device 4200. In addition, when the current limiter 110 limits the intensity of the supply current Isup to the limitation intensity, the capacitive block 130 may output compensation current Icom to the device load 1230.

Configurations and operations of the current limiter 110 and the capacitive block 130 have been described with reference to FIGS. 4 to 8. For brevity, redundant descriptions associated with the current limiter 110 and the capacitive block 130 will be omitted below.

The power supply management circuit 400 may be disposed at the back of a power input terminal T2 of the second electronic device 4200. Accordingly, the power supply management circuit 400 may be implemented with the minimum change of the previous design of the second electronic device 4200.

Figure 14:
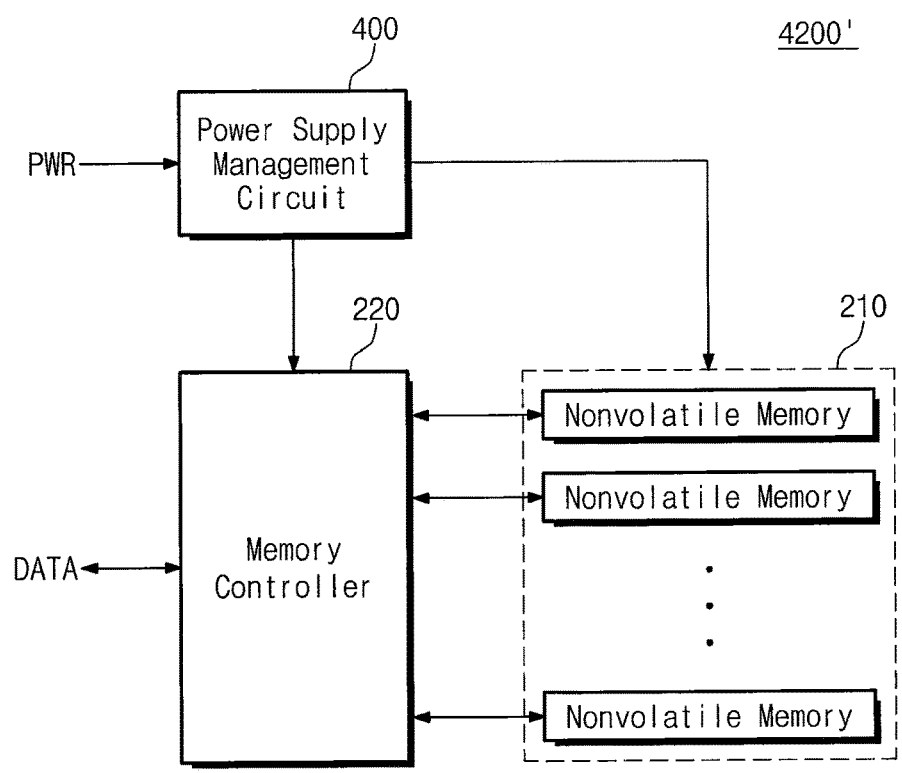
FIG. 14 is a block diagram illustrating a storage device as an example of a second electronic device of FIG. 13.

FIG. 14 is a block diagram illustrating a storage device as an example of a second electronic device of FIG. 13. A second electronic device 4200 of FIG. 13 may not include an internal power source. As an example of the second electronic device 4200, a storage device 4200' may not include an internal power source and may operate using a power supplied from an external device.

The storage device 4200' may provide a storage service while communicating with a host device (e.g., a first electronic device 1100 of FIG. 13). The storage device 4200' may exchange data with the host device. For example, when the data includes write data, the storage device 4200' may store the write data in response to a write command provided from the host device. The storage device 4200' may store data permanently or semi-permanently regardless of power supply. For example, when a read command is received from the host device, the storage device 4200' may provide the host device with data including read data.

The storage device 4200' may include one or more nonvolatile memories 210 and a memory controller 220. Each of the nonvolatile memories 210 may include a memory region for storing data. For example, when each of the nonvolatile memories 210 includes a NAND-type flash memory, each of the nonvolatile memories 210 may include a memory cell array formed along a plurality of word lines and a plurality of bit lines.

The memory controller 220 may control the overall operations of the storage device 4200'. The memory controller 220 may control operations of the nonvolatile memories 210. Under the control of the memory controller 220, data may be stored in the nonvolatile memories 210 or may be read therefrom.

The storage device 4200' may include a power supply management circuit 400 according to the example embodiments. The power supply management circuit 400 may receive power PWR from an external device (e.g., a first electronic device 1100 of FIG. 13). The power supply management circuit 400 may output operation power to at least one of the nonvolatile memories 210 and/or the memory controller 220 based on the power PWR. The nonvolatile memories 210 and/or the memory controller 220 may operate using the operation power provided from the power supply management circuit 400.

Configurations and operations of the power supply management circuit 400 have been described with reference to FIG. 13. For brevity, redundant descriptions associated with the power supply management circuit 400 will be omitted below.

In the example embodiments, when the second electronic device 4200 or the storage device 4200' includes the power supply management circuit 400, the operation voltage may not be lowered below the minimum operation voltage. Accordingly, the second electronic device 4200 or the storage device 4200' may operate stably.

Figure 15:
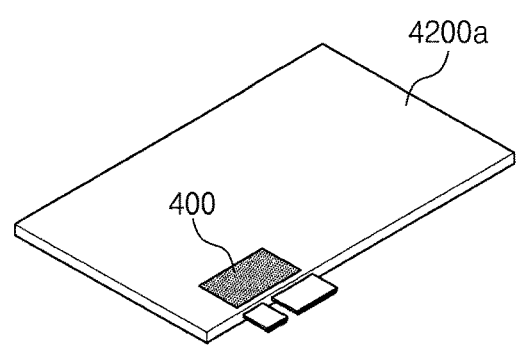
FIGS. 15 and 16 are conceptual diagrams illustrating example implementations for a storage device of FIG. 14.

FIG. 15 is a conceptual diagram illustrating an example implementation for a storage device of FIG. 14.

For example, a storage device 4200' of FIG. 14 may include a printed circuit board 4200a. One or more nonvolatile memories 210 and a memory controller 220 of FIG. 14 may be implemented in an integrated circuit chip and may be mounted on the printed circuit board 4200a. In addition, the power supply management circuit 400 according to the example embodiments may be implemented on the printed circuit board 4200a. That is, in the example embodiments of FIG. 15, the power supply management circuit 400 may be implemented on the printed circuit board 4200a together with the nonvolatile memories 210 and the memory controller 220.

Figure 16:
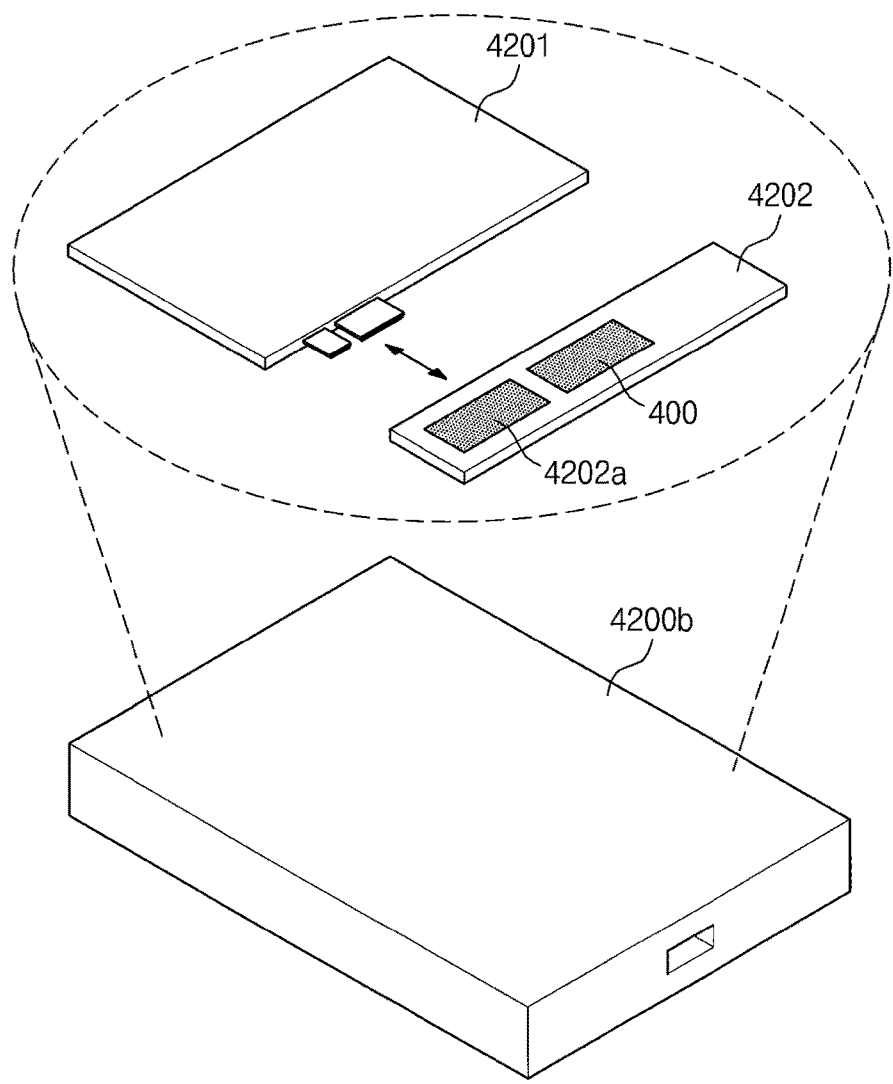

FIG. 16 is a conceptual diagram illustrating an example implementation for a storage device of FIG. 14.

For example, a storage device 4200' of FIG. 14 may be implemented in an external-type storage device 4200b. The external-type storage device 4200b may include a first printed circuit board 4201 and a second printed circuit board 4202.

For example, one or more nonvolatile memories 210 and a memory controller 220 of FIG. 14 may be implemented in an integrated circuit chip and may be mounted on the first printed circuit board 4201. The first printed circuit board 4201 may be connected with the second printed circuit board 4202.

The second printed circuit board 4202 may include an interface translation circuit 4202a. The interface translation circuit 4202a may perform translation between a first interface protocol, that is employed by the memory controller 220 mounted on the first printed circuit board 4201, and a second interface protocol, that is used for an access from an external device (e.g., a first electronic device 1100 of FIG. 13) of the external-type storage device 4200b. For example, if the memory controller 220 mounted on the first printed circuit board 4201 employs a PCIe protocol and the external device of the external-type storage device 4200b employs a USB protocol, the interface translation circuit 4202a may perform translation between the PCIe protocol and the USB protocol.

In the example embodiments of FIG. 16, a power supply management circuit 400 may be implemented on the second printed circuit board 4202. That is, the power supply management circuit 400 may be implemented on a different printed circuit board from the nonvolatile memories 210 and the memory controller 220. The power supply management circuit 400 according to the example embodiments may be implemented in various configurations.

Figure 17:
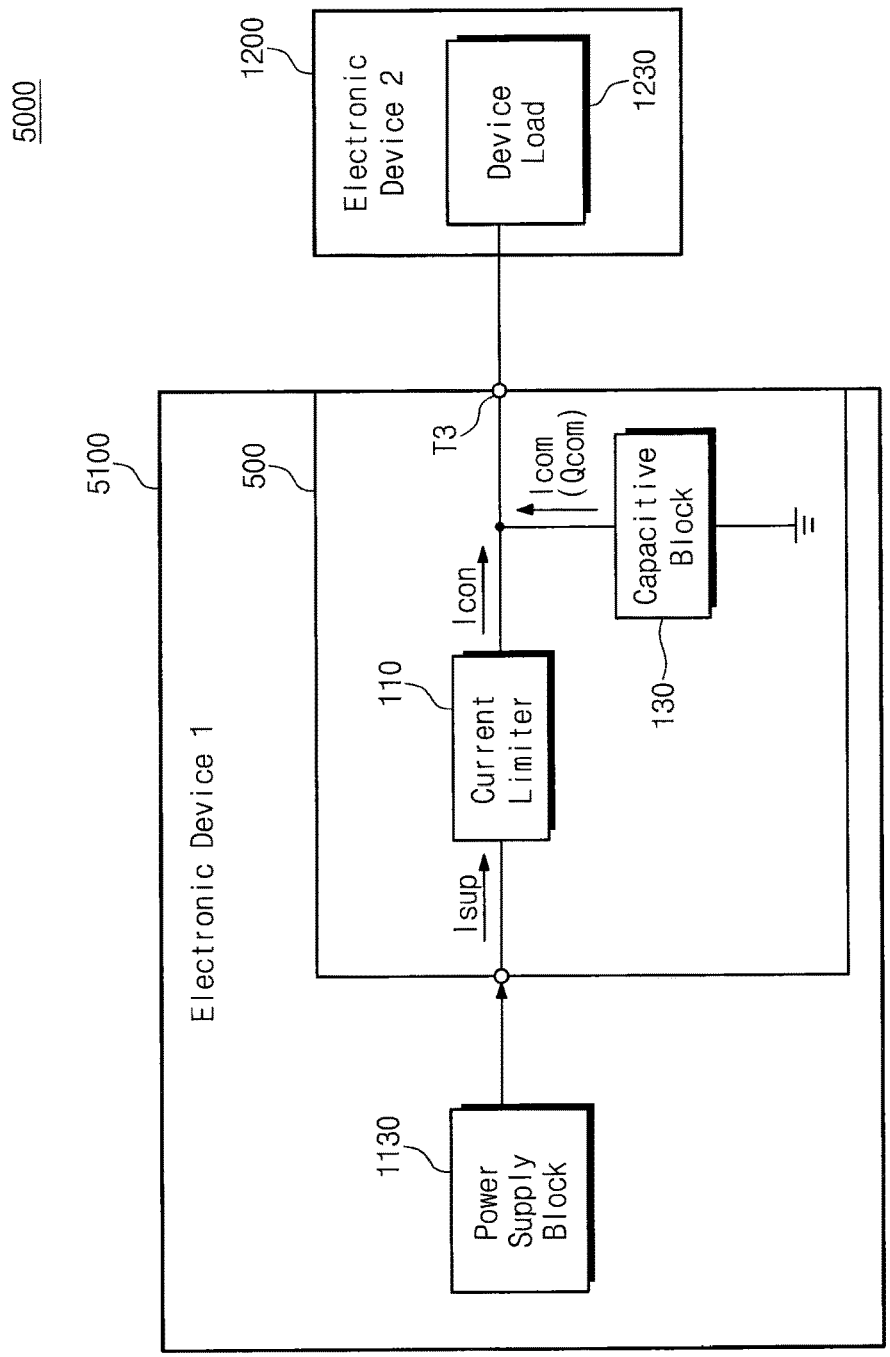
FIG. 17 is a block diagram illustrating an electronic system including a first electronic device that includes a power supply management circuit according to some embodiments of the present inventive concept.

FIG. 17 is a block diagram illustrating an electronic system including a first electronic device that includes a power supply management circuit according to some embodiments of the present inventive concept. An electronic system 5000 may include a first electronic device 5100 and a second electronic device 1200.

The first electronic device 5100 may be configured and operate similarly to a first electronic device 1100 described with reference to FIGS. 1 and 5. Configurations and operations of the second electronic device 1200 have been described with reference to FIGS. 1 and 5. For brevity, redundant descriptions associated with the first electronic device 5100 and the second electronic device 1200 will be omitted below.

Unlike the example embodiments described with reference to FIG. 5, the first electronic device 5100 may include a power supply management circuit 500. That is, in the example embodiments of FIG. 17, the power supply management circuit 500 may be included in the first electronic device 5100, rather than being separately provided from the electronic devices 5100 and 1200. The power supply management circuit 500 may include a current limiter 110 and a capacitive block 130.

The current limiter 110 may receive supply current Isup from a power supply block 1130. The current limiter 110 may limit intensity of the supply current Isup to be smaller than or equal to limitation intensity. The current limiter 110 may output consumption current Icon that has intensity limited to be smaller than or equal to the limitation intensity to the second electronic device 1200. Accordingly, a voltage of a power output terminal T3 connecting the power supply management circuit 500 to the second electronic device 1200 may be maintained to be greater than or equal to the minimum operation voltage for operating the second electronic device 1200. In addition, if the current limiter 110 limits the intensity of the supply current Isup to the limitation intensity, a capacitive block 130 may output compensation current Icom to the second electronic device 1200.

Configurations and operations of the current limiter 110 and the capacitive block 130 have been described with reference to FIGS. 4 to 8. For brevity, redundant descriptions associated with the current limiter 110 and the capacitive block 130 will be omitted below.

The power supply management circuit 500 may be disposed at the front of the power output terminal T3 of the first electronic device 5100. Accordingly, the power supply management circuit 500 may be implemented with the minimum change of the previous design of the first electronic device 5100.

Figure 18:
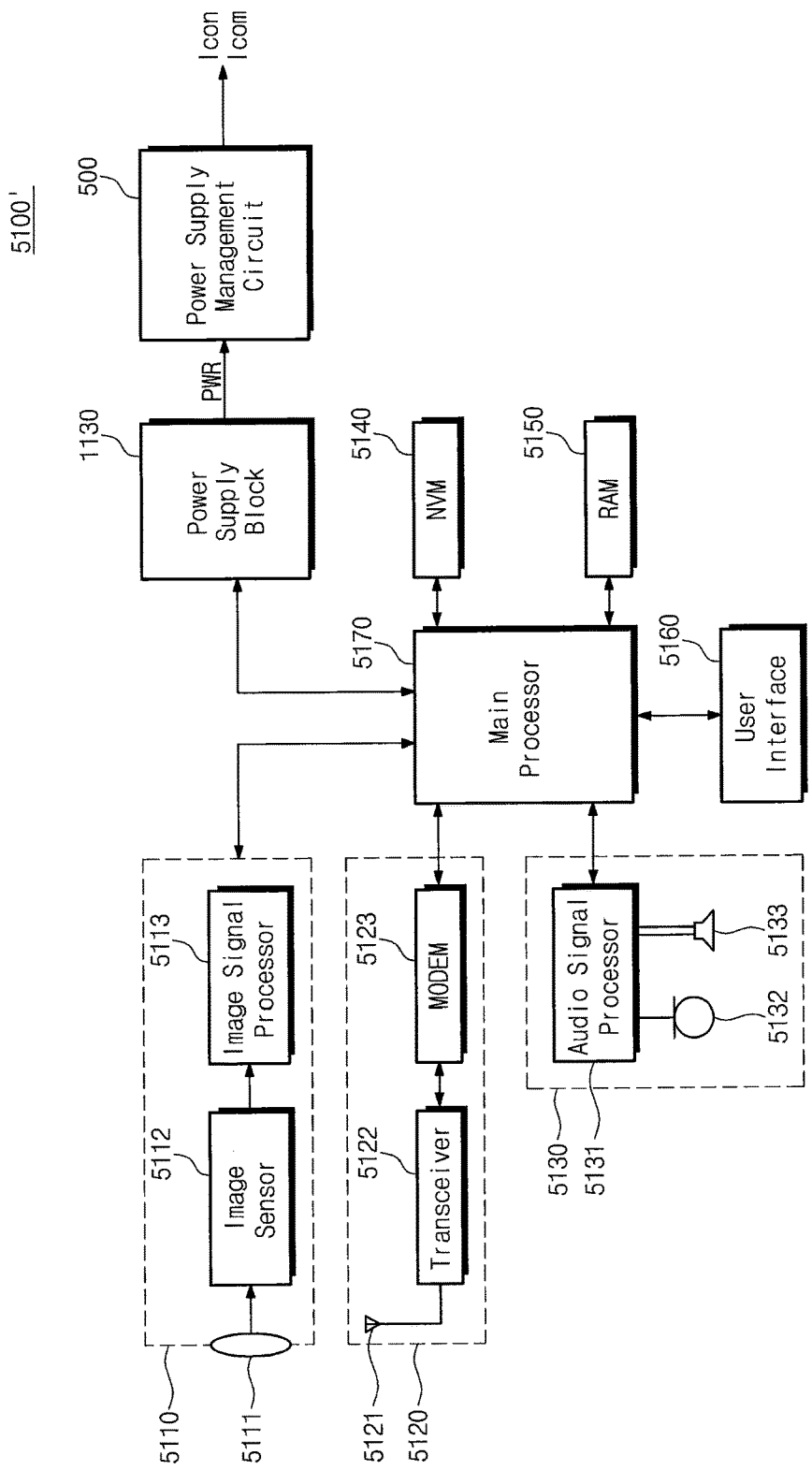
FIG. 18 is a block diagram illustrating a mobile electronic device as an example of a first electronic device of FIG. 17.

FIG. 18 is a block diagram illustrating a mobile electronic device as an example of a first electronic device of FIG. 17. As an example of a first electronic device 5100 of FIG. 17, a mobile electronic device 5100' may include an internal power source (i.e., a power supply block 1130).

The mobile electronic device 5100' may include an image processor 5110, a wireless communication block 5120, an audio processor 5130, a nonvolatile memory 5140, RAM 5150, a user interface 5160, and a main processor 5170. For example, the mobile electronic device 5100' may be one of various devices such as a portable communication terminal, a PDA, a PMP, a digital camera, a smart phone, a tablet, a wearable device, and/or the like.

The image processor 5110 may receive light through a lens 5111. An image sensor 5112 and an image signal processor 5113 included in the image processor 5110 may generate an image and/or image data based on the received light.

The wireless communication block 5120 may include an antenna 5121, a transceiver 5122, and a modulator/demodulator (MODEM) 5123. The wireless communication block 5120 may communicate with an external device outside the mobile electronic device 5100', in compliance with various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and/or radio frequency identification (RFID).

The audio processor 5130 may process an audio signal by means of an audio signal processor 5131. The audio processor 5130 may receive an audio input through a microphone 5132, or may provide an audio output through a speaker 5133.

The nonvolatile memory 5140 may store data required to be stored regardless of power supply. For example, the nonvolatile memory 5140 may include one or more of various nonvolatile memories such as a phase-change random access memory (PRAM), a magneto-resistive RAM (MRAM), a resistive RAM (ReRAM), and/or a ferroelectric RAM (FRAM). For example, the nonvolatile memory 5140 may be implemented with a memory package such as an embedded multimedia card (eMMC), a secure digital (SD) card, and/or the like.

The RAM 5150 may store data used to operate the mobile electronic device 5100'. For example, the RAM 5150 may be used as a working memory, an operation memory, a buffer memory, and/or the like of the mobile electronic device 5100'. The RAM 5150 may temporarily store data processed or to be processed by the main processor 5170.

The user interface 5160 may process interfacing between a user and the mobile electronic device 5100' under the control of the main processor 5170. For example, the user interface 5160 may include an input interface such as a keyboard, a keypad, a button, a touch panel, a touch screen, a touch pad, a touch ball, a camera, a microphone, a gyroscope sensor, a vibration sensor, and/or the like. For example, the user interface 5160 may include an output interface such as a display device, a motor, and/or the like. For example, the display device may include at least one of a liquid crystal display (LCD), a light emitting diode (LED) display, an organic LED (OLED) display, an active matrix OLED (AMOLED) display, and/or the like.

The main processor 5170 may control the overall operations of the mobile electronic device 5100'. The image processor 5110, the wireless communication block 5120, the audio processor 5130, the nonvolatile memory 5140, and the RAM 5150 may perform a user command provided through the user interface 5160 under the control of the main processor 5170. In addition, the image processor 5110, the wireless communication block 5120, the audio processor 5130, the nonvolatile memory 5140, and the RAM 5150 may provide a service to a user through the user interface 5160 under the control of the main processor 5170. The main processor 5170 may be implemented in a system-on-chip (SoC). For example, the main processor 5170 may include an application processor.

The mobile storage device 5100' may further include the power supply block 1130 and the power supply management circuit 500 according to the example embodiments. For example, the power supply block 1130 may include a PMIC for managing power used for an operation of the mobile electronic device 5100' and a battery used as a power source. The PMIC may appropriately convert power provided from the battery. Furthermore, the PMIC may provide the converted power to components of the mobile electronic device 5100', under the control of the main processor 5170.

The power supply block 1130 may be used as an internal power source of the mobile electronic device 5100'. Furthermore, when the mobile electronic device 5100' is connected with an external device that does not include an internal power source (e.g., a second electronic device 1200 of FIG. 17), the power supply block 1130 may supply the power PWR to the external device.

The power supply management circuit 500 may provide the power PWR output from the power supply block 1130 to the external device. Configurations and operations of the power supply management circuit 500 have been described with reference to FIG. 17. For brevity, redundant descriptions associated with the power supply management circuit 500 will be omitted below.

In the example embodiments, when the first electronic device 5100 or the mobile electronic device 5100' includes the power supply management circuit 500, the operation voltage applied to the external device may not be lowered below the minimum operation voltage. Accordingly, the first electronic device 5100 or the mobile electronic device 5100' may recognize the external device stably, and thus communication with the external device may be performed stably.

Figure 19:
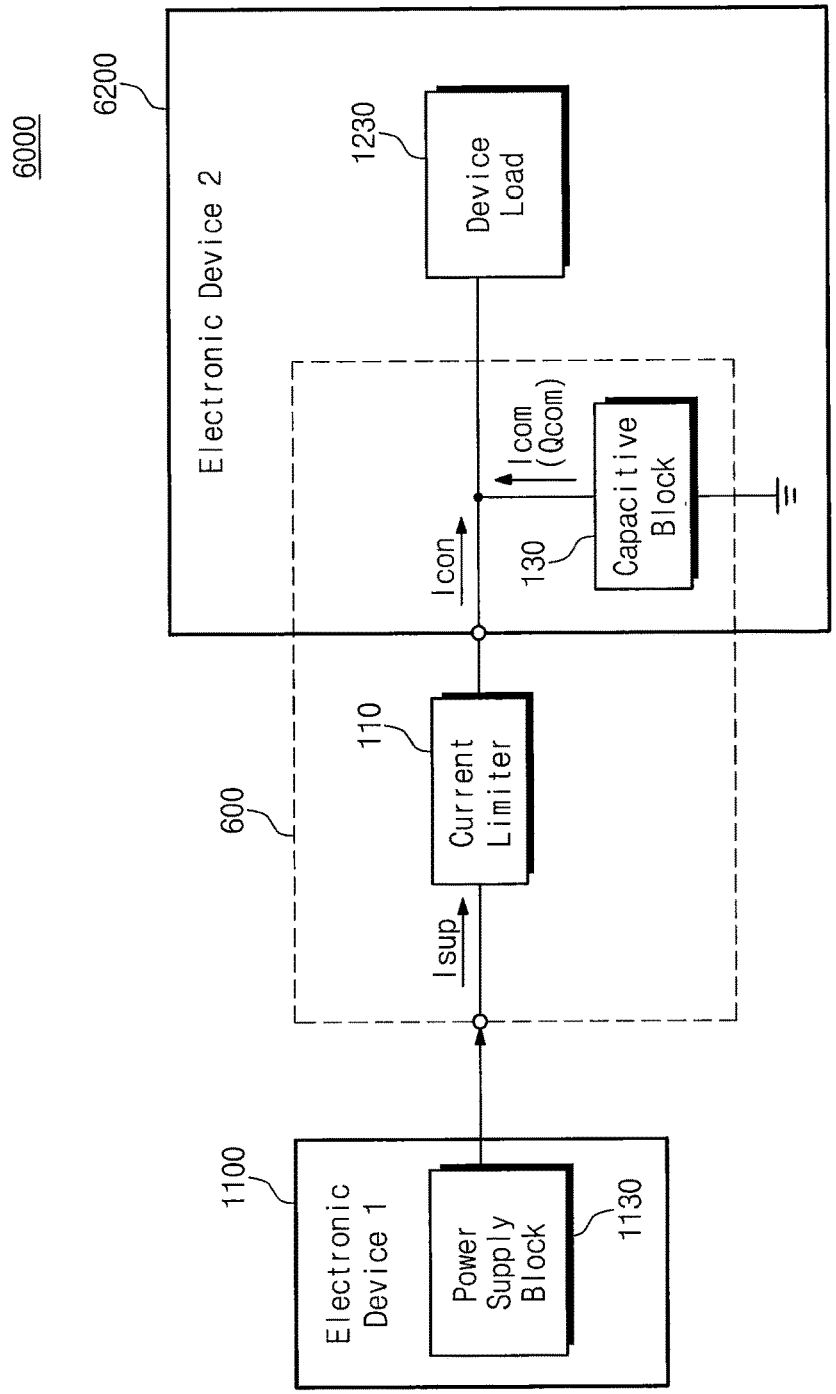
FIG. 19 is a block diagram illustrating an electronic system including a power supply management circuit according to some embodiments of the present inventive concept.

FIG. 19 is a block diagram illustrating an electronic system including a power supply management circuit according to some example embodiments. An electronic system 6000 may include a first electronic device 1100 and a second electronic device 6200.

Configurations and operations of the first electronic device 1100 have been described with reference to FIGS. 1 and 5. The second electronic device 6200 may be configured and may operate similarly to a second electronic device 1200 described with reference to FIGS. 1 and 5. For brevity, redundant descriptions associated with the first electronic device 1100 and the second electronic device 6200 will be omitted below.

Unlike the example embodiments described with reference to FIG. 5, the second electronic device 6200 may include a capacitive block 130. In addition, a current limiter 110 may be provided separately from the electronic devices 1100 and 6200. The current limiter 110 and the capacitive block 130 may be included in a power supply management circuit 600 according to some embodiments.

For example, the current limiter 110 may be included in a communication cable as illustrated in FIG. 9, and the capacitive block 130 may be disposed at the back of a power input terminal of the second electronic device 6200. In some embodiments of FIG. 19, components of the power supply management circuit 600 may be disposed to be distributed.

Configurations and operations of the current limiter 110 and the capacitive block 130 have been described with reference to FIGS. 4 to 8. For brevity, redundant descriptions associated with the current limiter 110 and the capacitive block 130 will be omitted below.

In FIG. 19, it is illustrated that the current limiter 110 is separately provided and the capacitive block 130 is included in the second electronic device 6200. However, the power supply management circuit 600 according to the example embodiments may be implemented in various configurations. For example, unlike FIG. 19, the current limiter 110 may be disposed at the front of a power output terminal of the first electronic device 1100, and the capacitive block 130 may be included in the second electronic device 6200. In some embodiments, the current limiter 110 may be included in the first electronic device 1100, and the capacitive block 130 may be provided separately from the electronic devices 1100 and 6200. FIG. 19 illustrates just an example to help better understanding, and the present disclosure is not limited thereto.

Circuits, chips, and devices according to the example embodiments of the present disclosure may be mounted using various kinds of semiconductor packages. For example, circuits, chips, and devices according to the example embodiments may be mounted using a package such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and/or wafer-level processed stack package (WSP).

According to the example embodiments of the present disclosure, even though an electronic device that does not include an internal power source consumes current of strong intensity, a voltage applied to the electronic device may not be lowered below the minimum operation voltage. Accordingly, electronic devices connected with each other may operate stably. In addition, a power supply management circuit according to the example embodiments may be implemented without changing the previous design of the electronic device or with the minimum change of the previous design.

The configuration shown in each of conceptual diagrams is to be understood just from the conceptual point of view. To help better understanding of the present disclosure, forms, structures, and sizes of each component shown in each conceptual diagram have been exaggerated or reduced. A configuration actually implemented may have a different physical shape from that shown in each conceptual diagram. Each conceptual diagram is not intended to limit the physical shape of the components.

A device configuration shown in each block diagram is provided to help better understanding of the present disclosure. Each block may be formed of smaller blocks according to functions. In some embodiments, a plurality of blocks may form a larger block according to a function. That is, the spirit or the scope of the present disclosure is not limited to the configuration shown in a block diagram.

Above, the present disclosure has been described based on some example embodiments. However, the purpose of the present disclosure may be achieved with a different manner from the above example embodiments including the subject matters of the present disclosure according to the nature of the art. Therefore, it should be understood that the above example embodiments are in descriptive and illustrative views, rather than restrictive views. That is, the spirits or the scope that includes the subject matters of the present disclosure and that may achieve a goal of the present disclosure should be included within the spirits or the scope of the inventive concepts of the present disclosure.

Accordingly, a modified or altered technical concept without departing from the scope or the spirit of the present disclosure is included in the scope of the claims below. The scope of the present disclosure is not limited to the above example embodiments.

What is claimed is:

1. A communication cable comprising:
   a first terminal configured to be connected to a mobile electronic device;
   a second terminal configured to be connected to a storage device;
   a third terminal configured to connect a capacitive block to the second terminal;
   a communications interface circuit positioned in the first terminal and configured to process communications between the mobile electronic device and the storage device; and
   a power supply management circuit configured to manage transfer of power supplied to the storage device from the mobile electronic device, and comprising a current limiter that is configured to limit an intensity of a first current to be smaller than or equal to a limitation intensity, the first current being received from the mobile electronic device, and to output a second current to the storage device, the second current having an intensity that is limited to be smaller than or equal to the limitation intensity,
   wherein the capacitive block is configured to output a third current to the storage device responsive to the current limiter limiting the intensity of the first current to the limitation intensity,
   wherein, when the intensity of the first current is smaller than or equal to the limitation intensity, the current limiter is configured to output the second current to the storage device without limiting the intensity of the first current and the capacitive block is configured to not output the third current, and
   wherein when the intensity of the first current exceeds the limitation intensity, the current limiter is configured to output the second current by limiting the intensity of the first current to the limitation intensity and the capacitive block is configured to output the third current.

2. The communication cable of claim 1, wherein a voltage of a node that connects the power supply management circuit to the storage device is greater than or equal to a minimum operation voltage for operating the storage device.

3. The communication cable of claim 1, wherein the third current compensates for the second current that is limited to have the limitation intensity, such that the storage device receives current having intensity exceeding the limitation intensity.

4. A communication cable comprising:
   a first terminal configured to be connected to a first electronic device;
   a second terminal configured to be connected to a second electronic device, such that the cable supports communications between the first and second electronic devices and power transfer from the first electronic device to the second electronic device;
   a third terminal configured to connect a supplemental current source to the second terminal; and
   a power management circuit coupled to the first and second terminals and comprising a current limiter circuit configured to limit a current drawn from the first electronic device via the cable,
   wherein, when a current demand of the second electronic device is less than a threshold amount, the current limiter circuit outputs a current to the second electronic device without limiting the current drawn from the first electronic device and without provision of current to the second electronic device from the supplemental current source and wherein, when the current demand of the second electronic device exceeds the threshold amount, the current limiter circuit limits the current drawn from the first electronic device and the supplemental-current source provides a supplemental current to the second electronic device.

5. The communications cable of claim 4, wherein the supplemental current source comprises a charge storage device.

6. The communications cable of claim 5, wherein the charge storage device comprises at least one capacitor.

7. The communications cable of claim 4, further comprising a communications interface circuit positioned in one of the first and second terminals.

8. The communications cable of claim 7, wherein the communications interface circuit and the current limiter circuit are positioned in the same one of the first and second terminals.

* * * * *